(12) United States Patent
Matsuyoshi

(10) Patent No.: US 7,209,715 B2
(45) Date of Patent: Apr. 24, 2007

(54) POWER AMPLIFYING METHOD, POWER AMPLIFIER, AND COMMUNICATION APPARATUS

(75) Inventor: Toshimitsu Matsuyoshi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 438 days.

(21) Appl. No.: 10/629,267

(22) Filed: Jul. 29, 2003

(65) Prior Publication Data
US 2004/0085127 A1    May 6, 2004

(30) Foreign Application Priority Data
Jul. 30, 2002 (JP) ............... 2002-221943

(51) Int. Cl.
*H04B 1/04* (2006.01)
(52) U.S. Cl. .................. 455/114.2; 455/126; 330/149
(58) Field of Classification Search ............... 455/126, 455/115.1, 114.2, 114.3; 330/149, 151, 136; 375/296, 297; 348/608
See application file for complete search history.

(56) References Cited

U.S. PATENT DOCUMENTS

| | | | | |
|---|---|---|---|---|
| 4,389,618 A | * | 6/1983 | Bauman | 330/149 |
| 5,365,187 A | * | 11/1994 | Hornak et al. | 330/10 |
| 5,760,646 A | * | 6/1998 | Belcher et al. | 330/149 |
| 6,091,297 A | * | 7/2000 | Bar-David et al. | 330/149 |
| 6,266,517 B1 | * | 7/2001 | Fitzpatrick et al. | 455/114.3 |
| 6,744,316 B2 | * | 6/2004 | Louis et al. | 330/151 |
| 6,934,341 B2 | * | 8/2005 | Sahlman | 375/297 |
| 2002/0041210 A1 | * | 4/2002 | Booth et al. | 330/149 |
| 2002/0079963 A1 | * | 6/2002 | Kusunoki | 330/149 |

FOREIGN PATENT DOCUMENTS

| | | |
|---|---|---|
| JP | 62-274906 | 11/1987 |
| JP | 6-69002 | 8/1994 |
| JP | 2000-261252 | 9/2000 |

* cited by examiner

Primary Examiner—Edward F. Urban
Assistant Examiner—Blane J. Jackson
(74) Attorney, Agent, or Firm—RatnerPrestia

(57) ABSTRACT

A power amplifier comprises an amplifier amplifying a high-frequency signal modulated by an input signal. An inverted envelope generates circuit generating an inverted envelope signal by using the input signal or the high-frequency signal The inverted envelope signal having an inverted envelope. A variable gain amplifier adjusts the amplitude of the inverted envelope signal, and a variable delay circuit adjusts a phase of the inverted envelope signal. A control circuit outputs a control signal to the variable gain amplifier and the variable delay circuit based on information about distortion or a signal level of the amplified high-frequency signal. The inverted envelope signal having been adjusted in amplitude or phase is injected to the high-frequency signal or the amplified high-frequency signal. The control circuit controls the variable gain amplifier or the variable delay circuit so that distortion or a signal level of the amplified high-frequency signal is minimum.

24 Claims, 31 Drawing Sheets

U1-L1=3dB

U2-U1=8dB

U5-U3=10dB

POWER AMPLIFYING METHOD, POWER AMPLIFIER, AND COMMUNICATION APPARATUS

BACKGROUND OF THE INVENTION

1. Field of the Invention

The present invention relates to a power amplifier, a power amplifying method, and a power amplifier with predistortion compensation. The present invention specifically concerns a power amplifier, a power amplifying method, and a power amplifier with predistortion compensation that are used mainly at radio communication base stations of mobile phones.

2. Related Art of the Invention

In recent years, there has been a demand in base station transmitters, for high-efficiency power amplifiers with high linearity. These amplifiers are required to amplify a number of signal channels in a collective manner. In order to increase the linearity of power amplifiers, for example, it is necessary to adopt distortion compensating circuits of a predistortion system or the like.

FIG. 29 is a block diagram showing a conventional power amplifier with predistortion compensation. Reference numeral 601 denotes an input terminal, reference numeral 602 denotes an output terminal, reference numeral 603 denotes a power divider, reference numeral 604 denotes a delay circuit, reference numeral 605 denotes a distortion generating circuit, reference numeral 606 denotes a variable attenuator, reference numeral 607 denotes a variable phase shifter, reference numeral 608 denotes a power combiner, reference numeral 609 denotes an amplifier, reference numeral 610 denotes a power divider, and reference numeral 611 denotes a control circuit.

In the power amplifier configured with predistortion compensation, a modulated carrier signal inputted to input terminal 601 is divided into two in the power divider 603. In response to one of the divided modulated carrier signals, the distortion generating circuit 605 generates a distorted signal. The distorted signal is adjusted in amplitude and phase in the variable attenuator 606 and the variable phase shifter 607. The resultant signal is fed to the power combiner 608. The other modulated carrier signal having been divided in the power divider 603 is delayed in the delay circuit 604, and then, the signal is inputted into the power combiner 608. The power combiner 608 combines the distorted signal and the modulated carrier signal and inputs the combined signal to the amplifier 609. The amplifier 609 amplifies the inputted signal and outputs the signal from the output terminal 602.

The power divider 610 is provided between the amplifier 609 and the output terminal 602. An output signal from the amplifier 609 is partially divided in the power divider 610 and is fed to the control circuit 611. The control circuit 611 controls the variable attenuator 606 and the variable phase shifter 607 so that the distorted signal inputted to the power combiner 608 is equal in amplitude to an adjacent channel leakage distortion, which is generated when the amplifier 609 amplifies a modulated carrier signal (hereinafter, simply referred to as "distortion" or "ACP"), in opposite phase.

As described above, in the power amplifier with predistortion compensation shown in FIG. 29, a distorted signal is generated which is equal in amplitude in opposite phase to distortion expected to be generated when the amplifier 609 amplifies a modulated carrier signal, and the signal is added to a modulated carrier signal to be inputted to the amplifier 609 (that is, a distortion component equal in amplitude to generated distortion in opposite phase is inputted to the amplifier), so that distortion generated in the amplifier 609 is reduced. Such a circuit configuration is disclosed, for example, Japanese Patent Laid-Open No. 2000-261252. The disclosure of the above reference is incorporated herein by reference in its entirety.

However, in the conventional power amplifier with predistortion compensation shown in FIG. 29, when a level difference is large between an adjacent channel leakage distortion component generated on the low-frequency side (hereinafter, referred to as ACPL) and an adjacent channel leakage distortion component generated on the high-frequency side (hereinafter, referred to as ACPU) in the amplifier 609, ACPL and ACPU generated in the distortion generating circuit 605 are both difficult to equalize in amplitude in opposite phase to ACPL and ACPU generated in the amplifier 609. Consequently, it is not possible to have a large suppressing amount of distortion on both of ACPL and ACPU.

In view of the above problem, the present invention has as its object the provision of a power amplifying method or a power amplifier whereby a level difference can be reduced between ACPL and ACPU generated in the power amplifier.

SUMMARY OF THE INVENTION

The first aspect of the present invention is a power amplifying method, comprising the steps of:

amplifying a high-frequency signal modulated by an input signal;

generating an inverted envelope signal by using the input signal or the high-frequency signal, the inverted envelope signal having an inverted envelope which is inverted one of both envelopes of the high-frequency signal, and injecting the inverted envelope signal into the high-frequency signal or the amplified high-frequency signal.

The second aspect of the present invention is the power amplifying method according to the first aspect of the present invention, wherein based on information about a signal level of the amplified high-frequency signal or a signal level of a modulation frequency band included in the high-frequency signal, adjustment is performed on (a) amplitude of the inverted envelope signal and/or (b) a phase of the inverted envelope signal or a phase of the high-frequency signal before the injecting step so that a signal level of the modulation frequency band is substantially minimum.

The third aspect of the present invention is a power amplifier, comprising:

amplifying means of amplifying a high-frequency signal modulated by an input signal, and inverted envelope generating means of generating an inverted envelope signal by using the input signal or the high-frequency signal, the inverted envelope signal having an inverted envelope which is inverted one of both envelopes of the high-frequency signal, wherein the inverted envelope signal is injected into the high-frequency signal or the amplified high-frequency signal.

The fourth aspect of the present invention is the power amplifier according to the third aspect of the present invention, further comprising:

first amplitude adjusting means of adjusting amplitude of the inverted envelope signal, first phase adjusting means of adjusting a phase of the high-frequency signal or the inverted envelope signal, and a control circuit of outputting a control signal to the first amplitude adjusting means and the first phase adjusting means based on information about a signal level of the amplified high-frequency signal or a signal level of a modulation frequency band included in the high-frequency signal, wherein the inverted envelope signal having been adjusted in amplitude or phase is injected into the high-frequency signal or the amplified high-frequency signal, and the control circuit controls the first amplitude adjusting means and/or the first phase adjusting means so that the modulation frequency band has a substantially minimum signal level.

The fifth aspect of the present invention is the power amplifier according to the fourth aspect of the present invention, further comprising a distortion generating circuit generating a distorted signal for canceling distortion generated from the amplifying means and injecting the distorted signal into an input side of the amplifying means.

The sixth aspect of the present invention is the power amplifier according to the fifth aspect of the present invention, wherein the inverted envelope signal is injected into the amplified high-frequency signal.

The seventh aspect of the present invention is the power amplifier according to the fifth aspect of the present invention, wherein the inverted envelope signal is injected via the distortion generating circuit to the high-frequency signal inputted to the amplitude means.

The eighth aspect of the present invention is the power amplifier according to the fifth aspect of the present invention, further comprising a baseband part of generating an I signal and a Q signal orthogonal to the I signal from the input signal, and a demodulating part demodulating the modulated high-frequency signal into the I signal and the Q signal, wherein the distortion generating circuit generates a distorted signal for canceling distortion in the amplified high-frequency signal, based on the I signal and Q signal generated in the baseband part and the I signal and Q signal outputted from the demodulating part.

The ninth aspect of the present invention is the power amplifier according to the fifth aspect of the present invention, wherein the distortion generating circuit generates the distorted signal when the inverted envelope signal adjusted in amplitude or phase is inputted.

The tenth aspect of the present invention is the power amplifier according to the fourth aspect of the present invention, wherein the inverted envelope generating means comprises an envelope detector of detecting an envelope of the high-frequency signal and a sign inversion circuit of inverting a sign of the envelope-detected signal, and the envelope-detected signal having the inverted sign is outputted as an inverted envelope signal.

The eleventh aspect of the present invention is the power amplifier according to the tenth aspect of the present invention, wherein the inverted envelope signal outputted from the inverted envelope generating means is injected into an input side of the amplifying means.

The twelfth aspect of the present invention is the power amplifier according to the ninth aspect of the present invention, further comprising:

second amplitude adjusting means of further adjusting amplitude of the inverted envelope signal inputted to the distortion generating circuit, the inverted envelope signal having been adjusted in amplitude or phase, and second phase adjusting means of further adjusting a phase of the inverted envelope signal inputted to the distortion generating circuit, the inverted envelope signal having been adjusted in amplitude or phase, wherein amplitude and/or a phase of a signal inputted to the distortion generating circuit is further adjusted by the second amplitude adjusting means and the second phase adjusting means so that the modulation frequency band has a substantially minimum signal level.

The thirteenth aspect of the present invention is the power amplifier according to the fourth aspect of the present invention, further comprising a baseband part generating an I signal and a Q signal orthogonal to the I signal, wherein the inverted envelope generating means calculates $-(I^2+Q^2)^{1/2}$ based on the I signal and the Q signal and outputs a result as the inverted envelope signal.

The fourteenth aspect of the present invention is the power amplifier according to the eigth aspect of the present invention, wherein the distortion generating circuit is provided in the baseband part.

The fifteenth aspect of the present invention is the power amplifier according to the thirteenth aspect of the present invention, wherein the inverted envelope generating means is provided in the baseband part.

The sixteenth aspect of the present invention is the power amplifier according to the fourth aspect of the present invention, further comprising first level detecting means of detecting a signal level of the amplified high-frequency signal, wherein the first amplitude adjusting means and/or the first phase adjusting means is controlled by the control circuit based on information acquired by the first level detecting means about the signal level of the amplified signal.

The seventeenth aspect of the present invention is the power amplifier according to the fourth aspect of the present invention, further comprising:

a low-pass filter connected to an output side of the amplifying means, and second level detecting means connected to an output side of the low-pass filter, wherein a signal of the modulation frequency band is taken out from the amplified high-frequency signal by the low-pass filter, a signal level of the modulation frequency band is detected by the second level detecting means, and the first amplitude adjusting means and/or the first phase adjusting means is controlled by the control circuit so that the modulation frequency band has a substantially minimum signal level.

The eighteenth aspect of the present invention is the power amplifier according to the twelfth aspect of the present invention, further comprising first level detecting means of detecting a signal level of the amplified high-frequency signal, wherein at least one of the first amplitude adjusting means, the first phase adjusting means, the second amplitude control means, and the second phase control means is controlled by the control circuit based on information acquired by the first level detecting means about a signal level of the amplified signal.

The nineteenth aspect of the present invention is the power amplifier according to the twelfth aspect of the present invention, further comprising:

a low-pass filter connected to an output side of the amplifying means, and second level detecting means connected to an output side of the low-pass filter, wherein a signal of the modulation frequency band is taken out from the amplified high-frequency signal by the low-pass filter, a signal level of the modulation frequency band is detected by the second level detecting means, and the first amplitude control means, the first phase control means, the second amplitude control means, and the second phase control means are controlled by the control circuit so that the modulation frequency band has a substantially minimum signal level.

The twentieth aspect of the present invention is the power amplifier according to the fourth aspect of the present invention, further comprising third level detecting means of detecting a signal level of a high-frequency signal before the signal is inputted to the amplifying means, wherein the first amplitude control means and/or the first phase control means is controlled based on the signal having been subjected to level detection.

The twenty-first aspect of the present invention is the power amplifier according to the twelfth aspect of the present invention, further comprising third level detecting means of detecting a signal level of a high-frequency signal before the signal is inputted to the amplifying means, wherein at least one of the first amplitude control means, the first phase control means, the second amplitude control means, and the second phase control means is controlled based on the signal having been subjected to level detection.

The twenty-second aspect of the power amplifier according to the twelfth aspect of the present invention, wherein the second amplitude adjusting means and/or the second phase adjusting means is controlled based on information about a signal level of the input signal or a signal level of the signal outputted from the power amplifier.

The twenty-third aspect of the present invention is the power amplifier according to the ninth aspect of the present invention, wherein the inverted envelope signal generated from the inverted envelope circuit or the inverted envelope signal having been adjusted in amplitude or phase is inputted to an input side of the distortion generating circuit or the distortion generating circuit via a series circuit constituted of a coil and a capacitor.

The twenty-fourth aspect of the present invention is the power amplifier according to the fourth aspect of the present invention, wherein the inverted envelope signal generated from the inverted envelope circuit or the inverted envelope signal having been adjusted in amplitude or phase is injected to the high-frequency signal or the amplified high-frequency signal via a series circuit constituted of a coil and a capacitor.

The twenty-fifth aspect of the present invention is the power amplifier according to the twenty-third or the twenty-fourth aspects of the present invention, wherein a resistor is used instead of the coil.

The twenty-sixth aspect of the present invention is a communication apparatus, comprising:

a transmitter which transmits a transmission signal and has a power amplifier described in the fourth aspect of the present invention, and a receiver of receiving a signal to be received.

BRIEF DESCRIPTION OF THE DRAWINGS

FIG. 3(a) shows an inverted envelope component not injected into an amplifier 106; and FIG. 3(b) shows an inverted envelope component injected into the amplifier 106;

FIG 3(b) shows that an inverted envelope component is injected into the amplifier 106;

Figure 1:
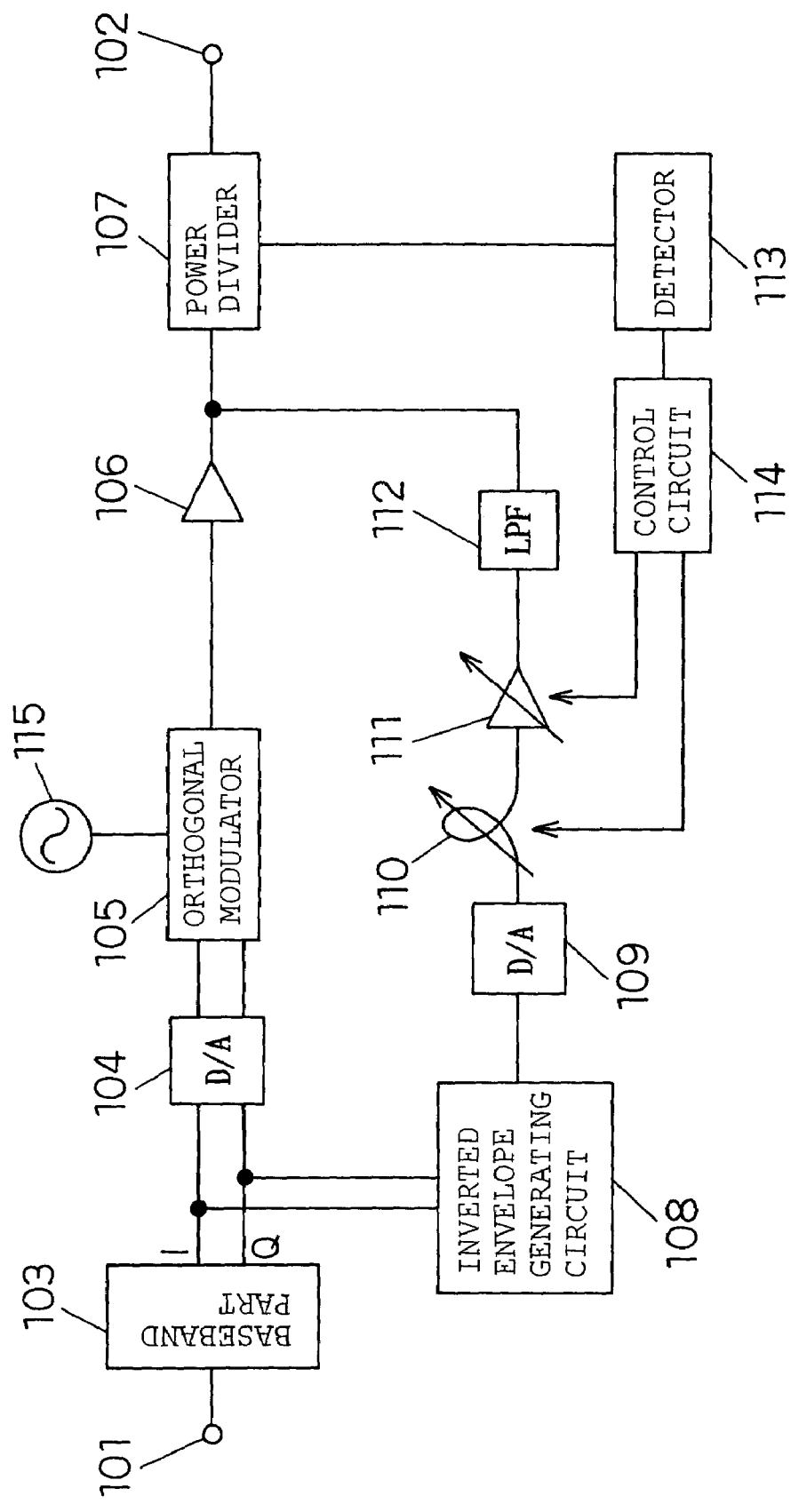
FIG. 1 is a block diagram showing a power amplifier according to Embodiment 1 of the present invention.

DESCRIPTION OF SYMBOLS 101, 141, 161, 201 Input terminal
102, 142, 162, 202 Output terminal
103, 403 Baseband part
104, 109 Digital-analog (D/A) converter
105 Orthogonal converter
106 Amplifier
106, 121, 132, 143, 145, 153 Power divider
108, Inverted envelope generating circuit
110, 134 Variable delay circuit
111, 119 Gain variable amplifier
112, 117 Low-pass filter
113, 155, 313 Signal level detector
114, 156 Control circuit
115 Local oscillator
116, 133, 148, 151 Variable attenuator
122 Envelope detector
123 Sign inversion circuit
131 Distortion generating circuit
144, 146 Delay circuit
147 Distortion generating element
149, 152 Variable phase shifter
150, 154 Power combiner
118, 157, 170 Control terminal
163, 166, 169, 203, 205, 207, 211 Capacitor
213, 217, 219, 222, 224 Capacitor
164 Power supply terminal
165, 168, 206, 212, 229 Resistor
167 Diode
181 Baseband distortion generating circuit
182 Demodulator
204, 218 Transmission line
208 Input-side power supply terminal
209, 210, 221, 225 Coil
214 Input-side matching circuit
215 Input-side power supply circuit
216 Transistor
220 Output-side power supply terminal
223 Inverted envelope injecting terminal
226 Output-side matching circuit
227 Output-side power supply circuit
228 Inverted envelope injecting circuit
301 Communication apparatus
302 Receiver
303 Transmitter
304 Antenna

PREFERRED EMBODIMENTS OF THE INVENTION

The following describes embodiments of the present invention in accordance with the accompanying drawings. In all of the embodiments and drawings, the same components are indicated by the same reference numerals. Embodiments 1 to 7 will be discussed below.

(Embodiment 1)

FIG. 1 is a block diagram showing a power amplifier according to Embodiment 1 of the present invention. In FIG. 1, the power amplifier comprises an input terminal 101, an output terminal 102, a baseband part 103, digital-analog (hereinafter, referred to as D/A) converters 104 and 109, an orthogonal modulator 105, an amplifier 106 serving as an example of amplifying means of the present invention, a power divider 107, an inverted envelope generating circuit 108 serving as an example of inverted envelope generating means of the present invention, a variable delay circuit 110 serving as an example of first phase adjusting means of the present invention, a gain variable amplifier 111 serving as an example of first amplitude adjusting means of the present invention, a low-pass filter 112, a signal level detector 113 serving as an example of first level detecting means of the present invention, a control circuit 114, and a local oscillator 115. For the gain variable amplifier 111, for example, a transistor such as a bipolar transistor is used. The control circuit 114 is constituted of, for example, a memory (storage device) such as a ROM.

In FIG. 1, the input terminal 101 is connected to the input of the baseband part 103 from which two outputs are outputted. One of the outputs is referred to as I output, and the other output is referred to as Q output. The I output and Q output are both inputted to the D/A converter 104, and the two terminal outputs of the converter 104 are connected to the input of the orthogonal modulator 105. Further, the output terminal of the local oscillator 115 is also connected to the orthogonal modulator 105. The output of the orthogonal modulator 105 is connected to the input of the amplifier 106, and the output of the modulator 106 is connected to the output terminal 102 via the power divider 107.

At the same time, the I output and Q output of the baseband part 103 are also inputted to the inverted envelope generating circuit 108, and the output of the circuit 108 is connected to the output terminal of the amplifier 106 via the D/A converter 109, the variable delay circuit 110, the gain variable modulator 111, and the low-pass filter 112.

The other output terminal of the power divider 107 is connected to the input of the signal level detector 113, and the output of the detector 113 is inputted to the control terminals of the variable delay circuit 110 and the gain variable amplifier 111 via the control circuit 114.

Figure 2:
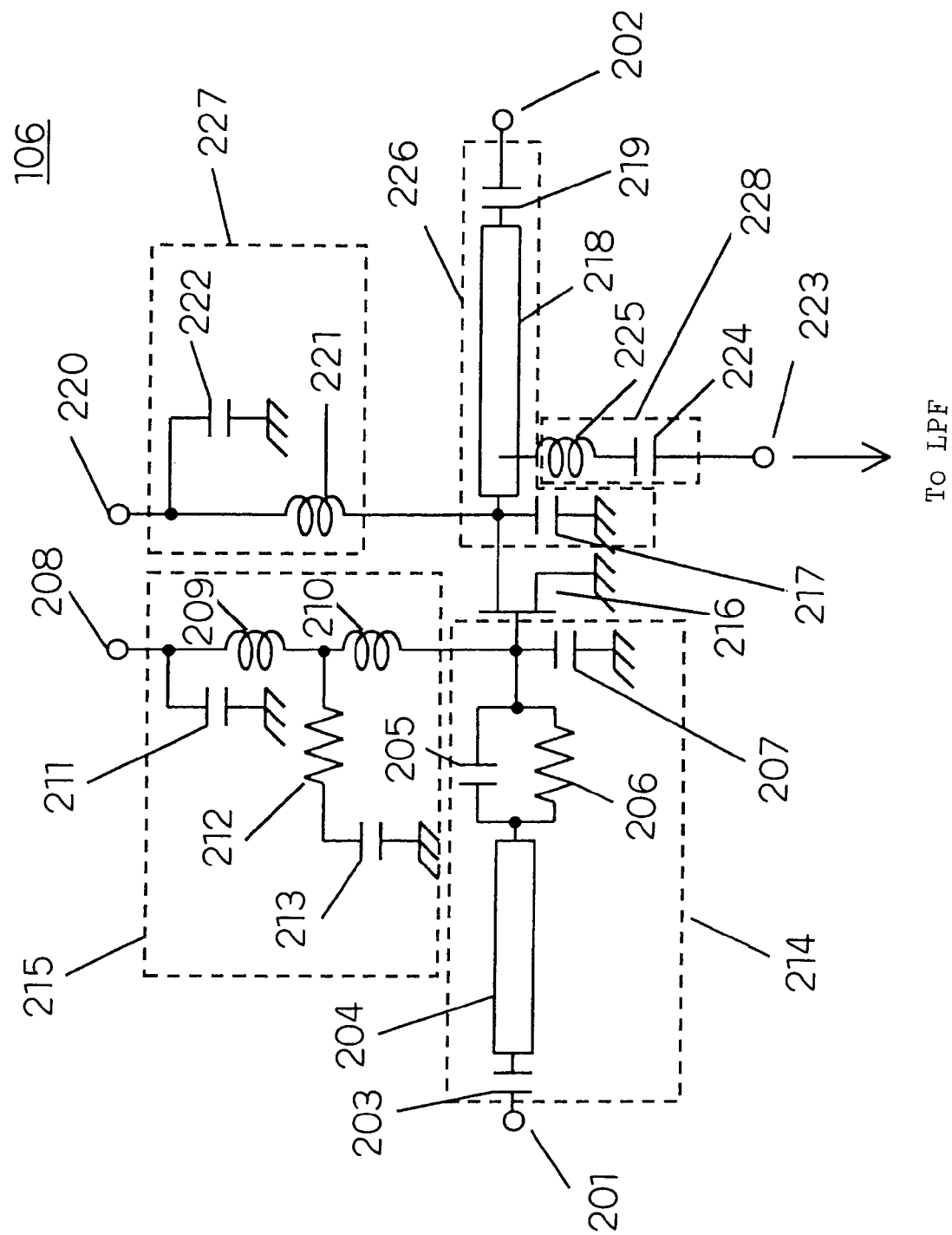
FIG. 2 is a diagram showing a signal spectrum on each terminal of an amplifier with predistortion compensation according to Embodiment 1 of the present invention.

FIG. 2 shows a circuit configuration of the amplifier 106. In FIG. 2, the amplifier comprises an input terminal 201, an input-side matching circuit 214, a transistor 216, an output-side matching circuit 226, an output terminal 202, an input-side power supply terminal 208, an input-side power supply circuit 215, an output-side power supply terminal 220, an output-side power supply circuit 227, an inverted envelope injecting terminal 223, and an inverted envelope injecting circuit 228.

The input terminal 201 is connected to the input-side matching circuit 214, and the output of the matching circuit 214 is connected to the input of the transistor 216. The output of the transistor 216 is connected to the output-side matching circuit 226, and the output of the matching circuit 226 is connected to the output terminal 202. Further, one end of the input-side power supply circuit 215 is connected to the input of the transistor 216 and the other end is connected to the input-side power supply terminal 208. Similarly, one end of the output-side power supply circuit 227 is connected to the output of the transistor 216 and the other end is connected to the output-side power supply terminal 220. Moreover, the inverted envelope injecting terminal 223 is connected to the output of the transistor 216 via the inverted envelope injecting circuit 228.

As shown in FIG. 2, the input-side matching circuit 214 comprises capacitors 203, 205, and 207, a transmission line 204, and a resistor 206. The output-side matching circuit 226 comprises of capacitors 217 and 219 and a transmission line 218. Further, the input-side power supply circuit 215 comprises coils 209 and 210, capacitors 211 and 213, and a resistor 212. The output-side power supply circuit 227 comprises a coil 221 and a capacitor 222. Moreover, the inverted envelope injecting circuit 228 comprises a capacitor 224 and a coil 225.

Referring to FIG. 1, the following will describe the operation of the power amplifier configured thus according to the present embodiment. Digital data such as voice and data is inputted to the input terminal 101, and the data is converted into an I signal and a Q signal, which are orthogonal signals, in the baseband part 103. The I and Q signals are converted into analog I and Q signals in the D/A converter 104. The analog IQ signals are subjected to orthogonal modulation in the orthogonal modulator 105 by using the local oscillator 115, and the signals are inputted to the input terminal of the amplifier 106.

On the other hand, the IQ signals generated in the baseband part 103 are also inputted to the inverted envelope generating circuit 108, which outputs a signal of a value calculated by an operation of $-(I^2+Q^2)^{1/2}$ The signal is converted into an analog signal by the D/A converter 109, is adjusted in delay time by the variable delay circuit 110, and is adjusted in signal level by the gain variable amplifier 111. Spurious components are removed in the low-pass filter 112. A signal having been subjected to this processing is injected into the output terminal of the amplifier 106.

Figure 3:
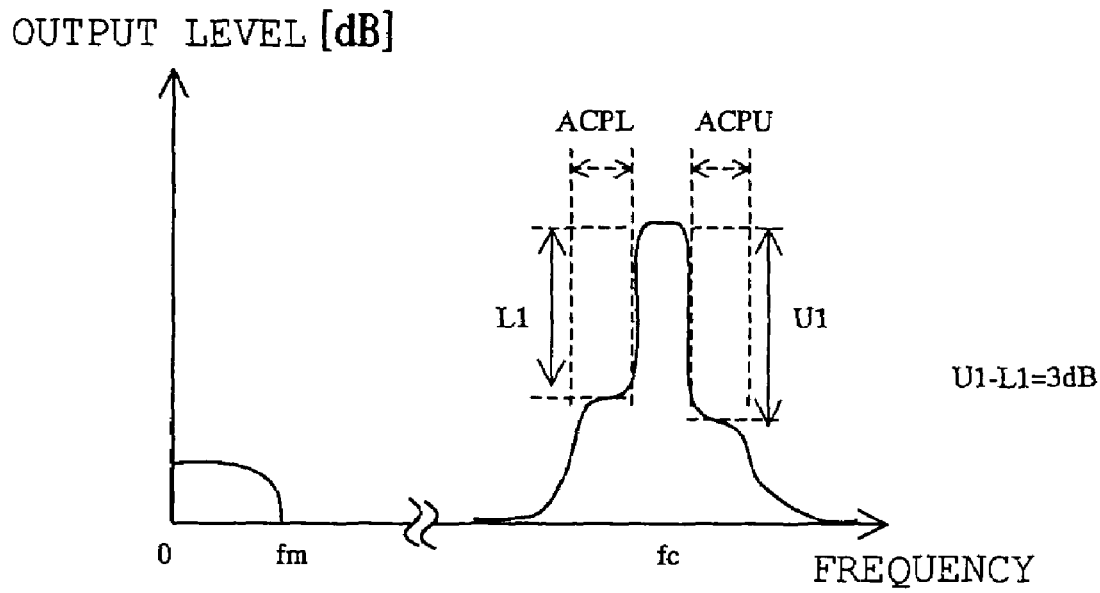
FIGS. 3(a)–(b) are diagrams showing a frequency spectrum of a distortion component appearing in the power amplifier according to Embodiment 1 of the present invention.
Figure 3:
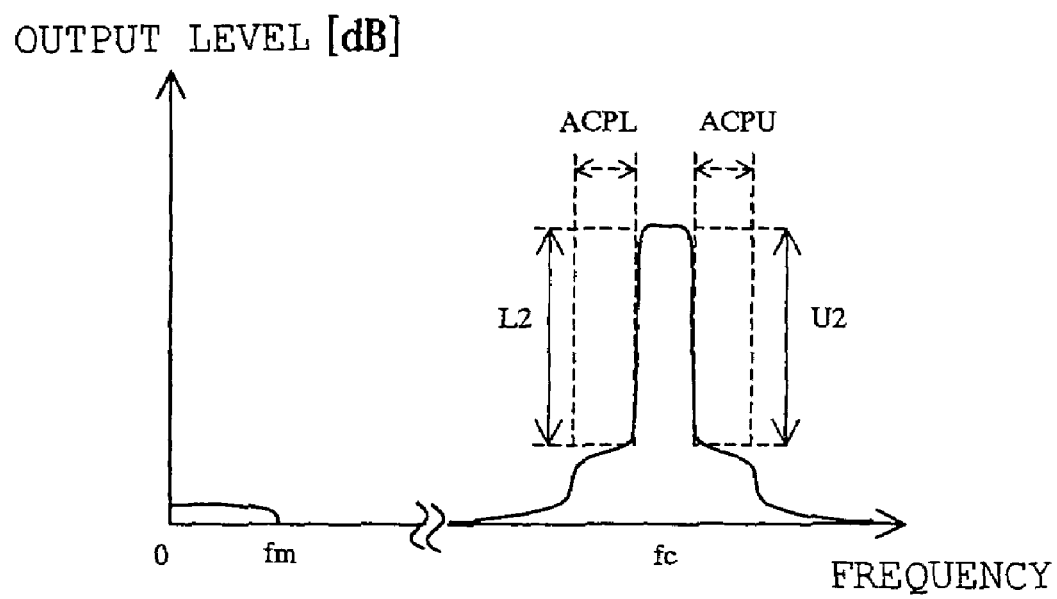
Figure 31:
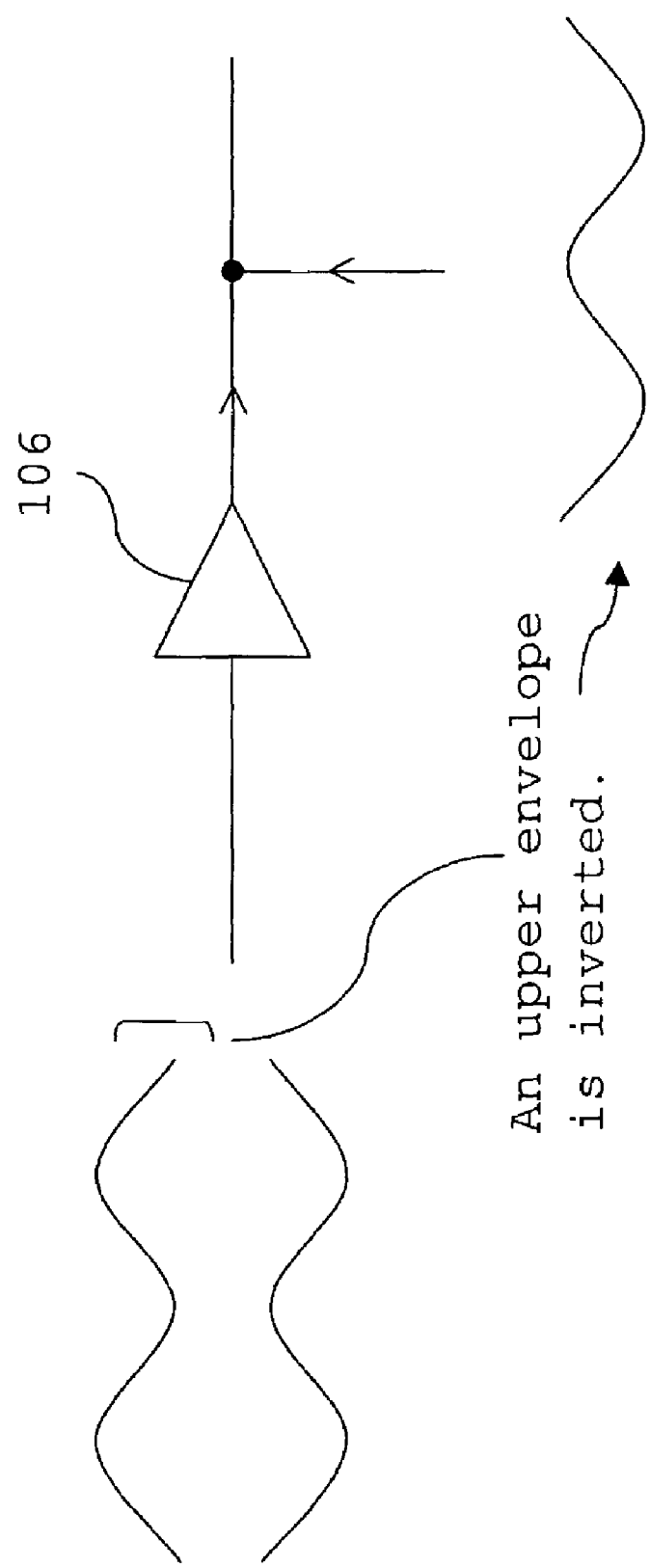
FIG. 31 is an explanatory diagram showing a principle of the power amplifier according to Embodiment 1 of the present invention.

In the present embodiment, a lower envelope component of a signal that is inputted to the amplifier 106 is generated in the inverted envelope generating circuit 108 by inverting an upper envelope component of the signal (See FIG. 31.), and the inverted envelope component serving as an example of an inverted envelope signal of the present invention is injected into the output terminal of the amplifier 106. The distortion characteristics appearing in the amplifier 106 are changed according to the presence or absence of the inverted envelope component and amplitude and a phase at the injection of the inverted envelope component into the output terminal of the amplifier 106. FIG. 3 shows a frequency spectrum of a distortion component appearing in the amplifier 106 when a carrier signal modulated by a wide-band modulating signal is inputted to the amplifier 106. In FIG. 3, reference character fc denotes a carrier frequency and reference character fm denotes a maximum frequency of a modulation frequency. For example, when an inverted envelope component is not injected into the amplifier 106, as shown in FIG. 3(a), an ACP component appearing in the amplifier 106 has a difference of about 3 dB between ACPL and the ACPU (U1–L1). Further, a distortion component also appears in a modulation frequency band (DC to a frequency fm) which is a low-frequency band (a signal in the modulation frequency band of the present invention corresponds to the distortion component as an example). However, in the present embodiment, the injection level of the inverted envelope component (i.e., amplitude) and a delay on an injection path (i.e., a phase) are adjusted by the gain variable amplifier 111 and the variable delay circuit 110 to the same level as that of a distortion component in a modulation frequency band that is generated by the amplifier 106 (that is, amplitude is adjusted), and the delay time of the injection path is adjusted (that is, a phase is adjusted), and injection is performed. Thus, as shown in FIG. 3(b), distortion components of modulation frequency band that are generated by the modulator 106 can be reduced. At the same time, ACPL and the ACPU that are generated in the amplifier 106 become substantially equal in level (L2=U2). Moreover, the absolute level of the ACP can be also reduced by about 8 dB as compared with the absence of injection of an inverted envelope component (U2–U1).

In the present embodiment, an inverted envelope component is injected into the amplifier 106 via the inverted envelope injecting circuit 228 shown in FIG. 2. The coil 225 in the inverted envelope injecting circuit 228 is sufficiently low in impedance relative to a modulation frequency band and is sufficiently high in impedance relative to a frequency of a high-frequency signal. Thus, it is possible to effectively inject an inverted envelope component while hardly affecting a frequency of a high-frequency signal. Moreover, the capacitor 224 prevents bias current from flowing into the inverted envelope injecting circuit 228.

An output signal amplified in the amplifier 106 is divided into two by the power divider 107, and one of the divided output signals is outputted to the output terminal 102. Further, the other output signal from the power divider 107 is subjected to level detection in the signal level detector 113, and the detected signal is inputted to the control circuit 114. The detected signal corresponds to an example of information about a signal level of an amplified high-frequency signal according to the present invention. From the control circuit 114, a control voltage is outputted according to the input level, and the control voltage is inputted to the control terminals of the variable delay circuit 110 and the gain variable amplifier 111 so as to control the delay time of the variable delay circuit 110 and the gain of the gain variable amplifier 111. Hence, even when an operating point (output power level) of the amplifier 106 is changed, it is possible to perform control so as to optimize the level and the delay time of an inverted envelope component injected into the output terminal of the amplifier 106 according to the change.

With the configuration of the present embodiment, it is possible to reduce a level difference between distortion components appearing on both sides of a signal band.

Further, with the configuration of the present embodiment in which an inverted envelope component of an input signal is generated by using digital IQ signals, an inverted envelope component can be generated by signal processing in a low-frequency band. Thus, it is possible to generate an inverted envelope component with high accuracy and to have a simple circuit configuration and control.

In the present embodiment, a modulating signal of a single wave was discussed as an example. In the case of a plurality of modulating signals, the same operation is performed and the same effect is achieved.

Figure 4:
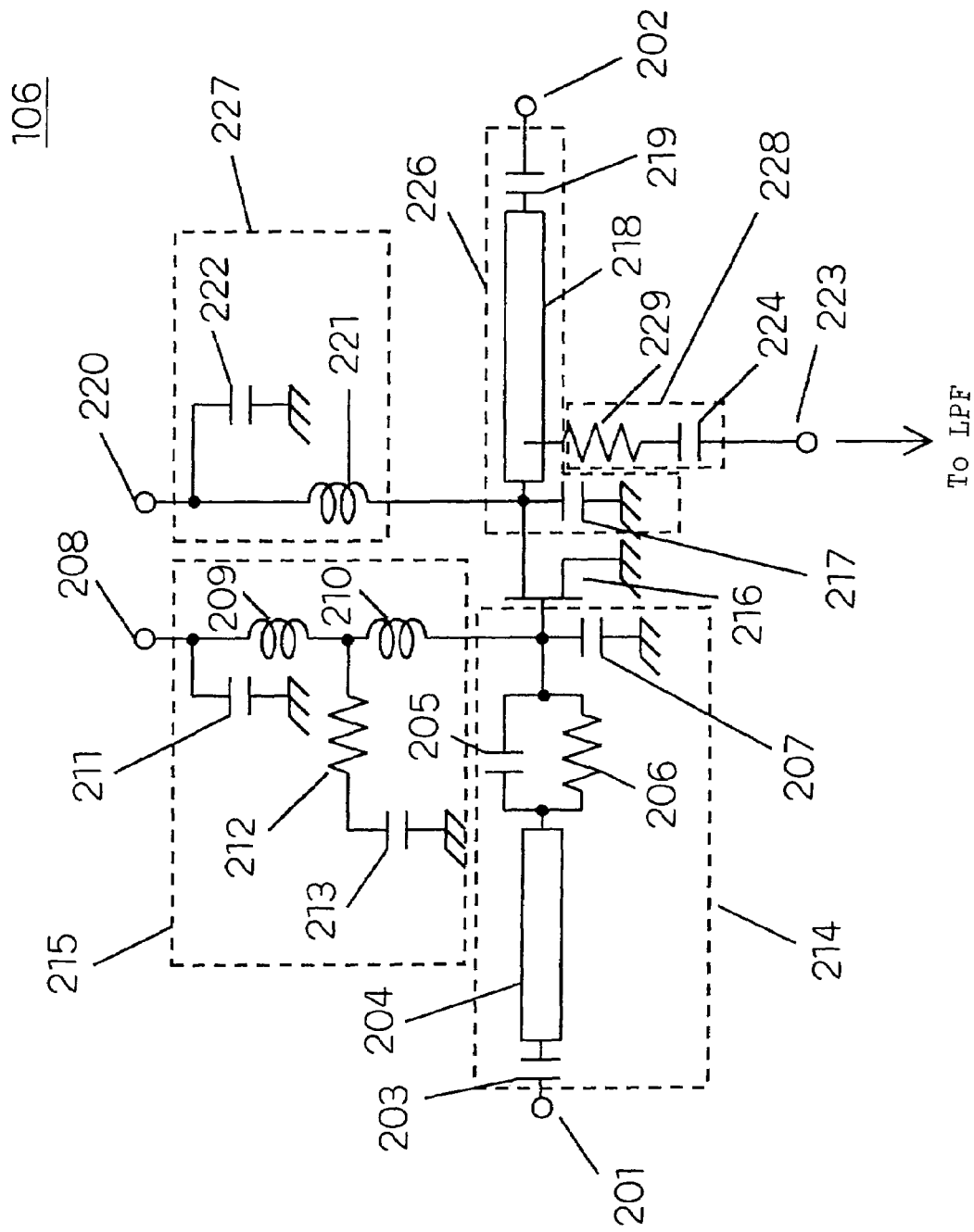
FIG. 4 is a diagram showing another circuit configuration of the amplifier in the power amplifier according to Embodiment 1 of the present invention.

The circuit of FIG. 2 is used for the amplifier 106 of the present embodiment. The configuration of FIG. 4 is also applicable, in which an inverted envelope component is injected via the capacitor 224 and the resistor 229. In this case, it is desirable that the resistor 229 have a relatively high resistance value with relative to a load impedance.

Figure 5:
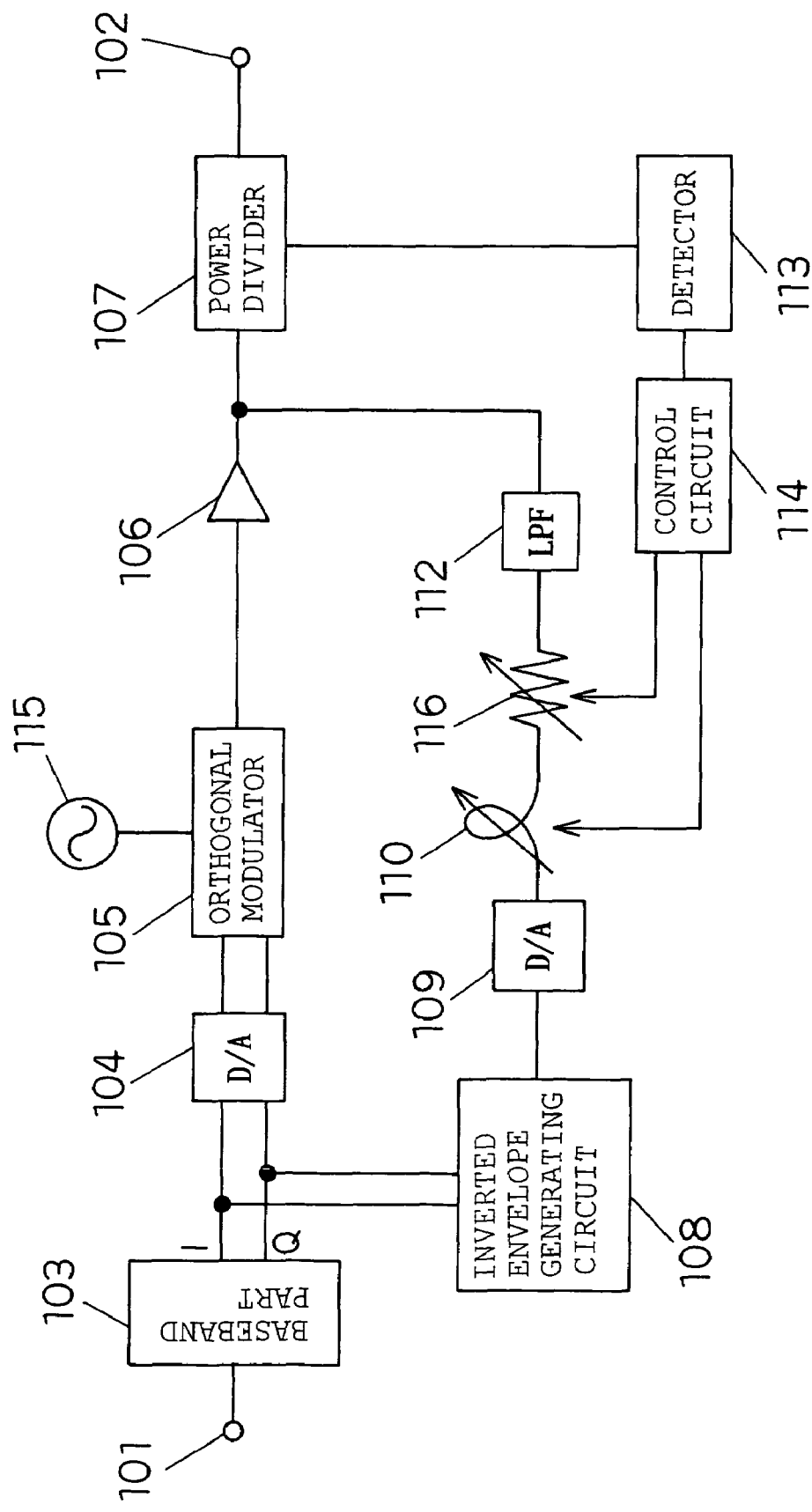
FIG. 5 is a block diagram showing another configuration of the power amplifier according to Embodiment 1 of the present invention.

The gain variable amplifier 111 is used in the present embodiment. When an output level of the inverted envelope generating circuit 108 satisfies a desired level of injection to the amplifier 106, as shown in FIG. 5, a variable attenuator 116 can be used instead of the gain variable amplifier as an example of first amplitude adjusting means of the present invention. Also in this case, the same effect can be obtained as the present embodiment.

The variable delay circuit 110 is used in the present embodiment. A variable phase shifter can be used instead. Also in this case, the same effect can be obtained as the present embodiment.

Although the variable delay circuit 110, the gain variable amplifier 111, and the low-pass filter 112 are arranged in this order in the present embodiment, these components can be arranged in any order. Further, although the variable delay circuit 110 is inserted into a path of transmitting an inverted envelope component in this configuration, it is more desirable to insert the delay circuit 110 into a path between the baseband 103 and the amplifier 106 in some cases.

Although the low-pass filter 112 is used in the present embodiment, the low-pass filter 112 can be omitted when the spurious band has a sufficiently low signal level.

Figure 6:
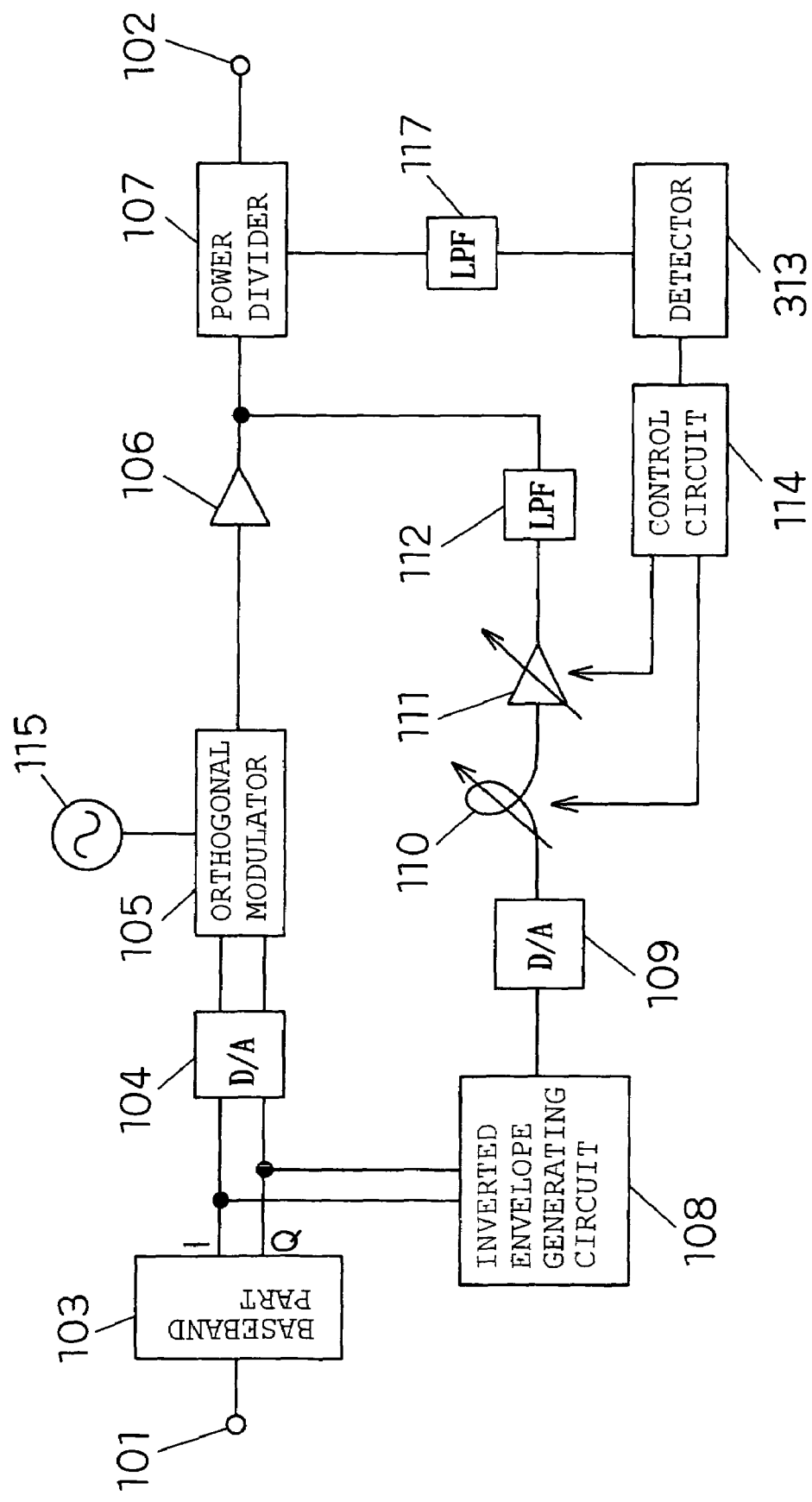
FIG. 6 is a block diagram showing another configuration of the power amplifier according to Embodiment 1 of the present invention.
Figure 7:
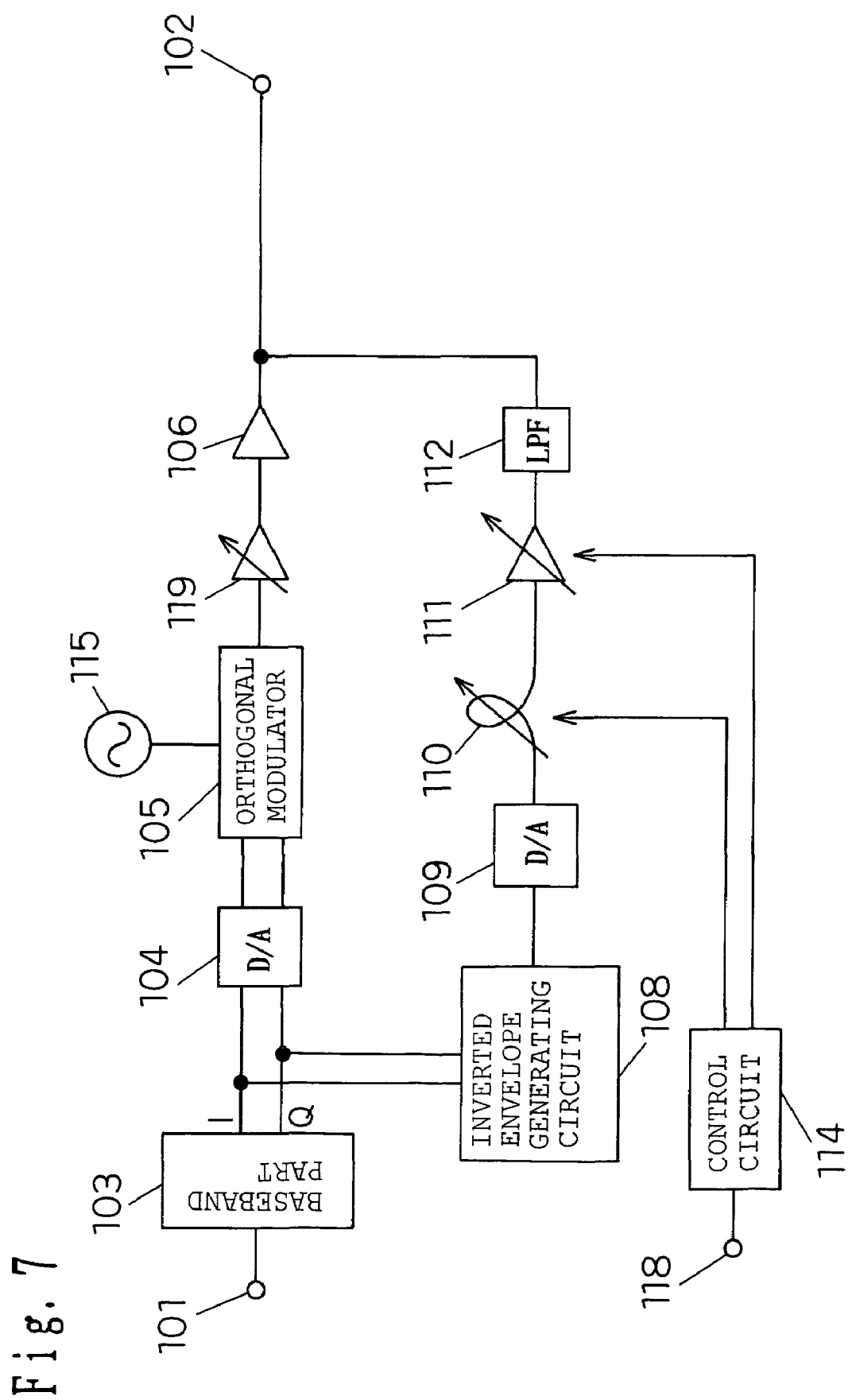
FIG. 7 is a block diagram showing another configuration of the power amplifier according to Embodiment 1 of the present invention.

In the present embodiment, by detecting an output power level in the signal level detector 113, the variable delay circuit 110 and the gain variable amplifier 111 (variable attenuator 116 in the configuration of FIG. 5) are controlled according to the level. The following method is also applicable to control the variable delay circuit 110 and the gain variable amplifier 111 (variable attenuator 116 in the configuration of FIG. 5): in the configuration of FIG. 6, the other of the outputs divided into two in the power divider 107 is connected to a signal level detector 313, which is an example of second level detecting means of the present invention, via the low-pass filter 117. With this configuration, only a distortion component in a modulation frequency band (low-frequency band) is extracted from an output signal of the amplifier 106, and the level (corresponding to information about a signal level of a modulation frequency band included in an amplified high-frequency signal of the present invention) can be detected. Control voltage is outputted by the control circuit 114 according to the detected level, and the variable delay circuit 110 and the gain variable amplifier 111 (variable attenuator 116 in the configuration of FIG. 5) can be controlled according to the control voltage. To be specific, the control voltage is determined so as to have a minimum detected level. In addition, as shown in FIG. 7, the following method is applicable: information about an output power level or a gain of the gain variable amplifier 119 is acquired in advance from the control signal terminal 118, control voltage is generated in the control circuit 114 by using the information, and the variable delay circuit 110 and the gain variable amplifier 111 are controlled. In this case, the power divider 107 connected to the output of the amplifier 106 is not necessary, thereby reducing a loss in the output circuit of the amplifier 106.

(Embodiment 2)

Figure 8:
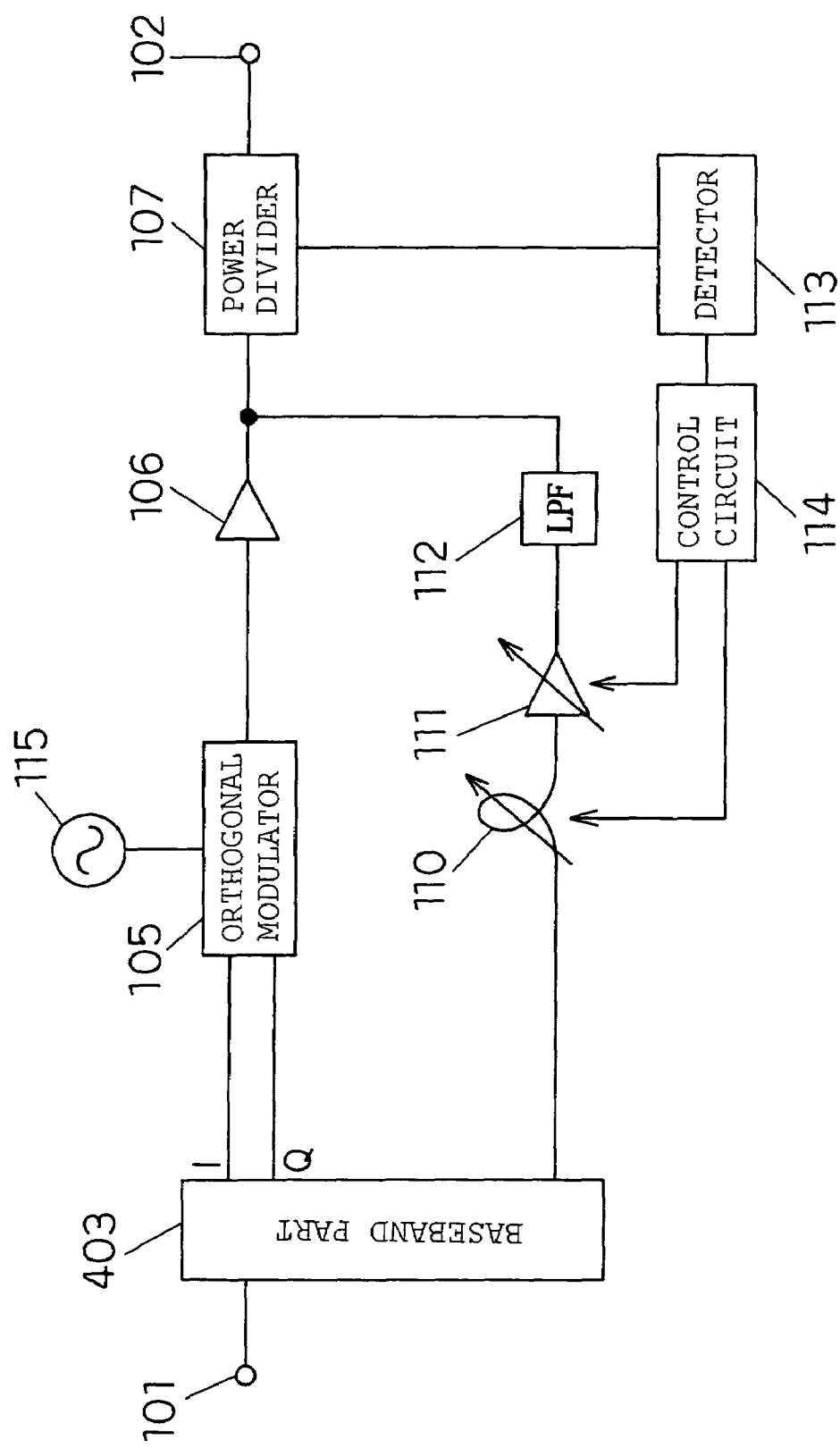
FIG. 8 is a block diagram showing a power amplifier according to Embodiment 2 of the present invention.

FIG. 8 is a block diagram showing a power amplifier according to Embodiment 2 of the present invention. In FIG. 8, the same components as those of Embodiment 1 are indicated by the same reference numerals as FIG. 1. Only different points from Embodiment 1 will be discussed below.

In Embodiment 1, an inverted envelope component is generated by inputting digital IQ signals generated in the baseband part 103 to the inverted envelope generating circuit 108. The present embodiment is different in that the functions of an inverted envelope generating circuit and a D/A converter are included in a baseband part 403. The other configurations are the same as those of Embodiment 1.

The operating principle of the present embodiment is the same as Embodiment 1, so that the same effect as Embodiment 1 can be obtained. Further, the plurality of functions are included in the baseband part 403 of one package, so that a smaller size can be achieved as compared with Embodiment 1.

As with Embodiment 1, both of a modulating signal of a single wave and a modulating signal of a plurality of waves can be reduced in level difference between distortion components occurring on both sides of a high-frequency signal band in the present embodiment.

As with Embodiment 1, a gain variable amplifier 111 is used in the present embodiment. When an output level of an inverted envelope generating circuit 108 satisfies a desired level of injection to an amplifier 106, as shown in FIG. 5 of Embodiment 1, a variable attenuator 116 can be used instead of the gain variable amplifier. Also in this case, the same effect can be obtained as the present embodiment.

As with Embodiment 1, a variable delay circuit 110 is used in the present embodiment. A variable phase shifter can be used instead. Also in this case, the same effect as the present embodiment can be obtained.

As with Embodiment 1, the variable delay circuit 110, the gain variable amplifier 111, and a low-pass filter 112 are arranged in this order in the present embodiment. These components can be arranged in any order. Further, although the variable delay circuit 110 is inserted into a path of transmitting an inverted envelope component in this configuration, it is more desirable to insert the circuit 110 into a path between the baseband part 103 and the amplifier 106 in some cases. Also in this case, the same effect can be obtained.

Moreover, although the low-pass filter 112 is used in the present embodiment, the low-pass filter 112 can be omitted when a spurious band has a sufficiently low signal level.

In the present embodiment, by detecting an output power level in a signal level detector 113, the variable delay circuit 110 and the gain variable amplifier 111 (variable attenuator 116 in the configuration of FIG. 5) are controlled according to the level. It is also possible to adopt the configurations of performing the control described in FIGS. 6 and 7 in Embodiment 1.

(Embodiment 3)

Figure 9:
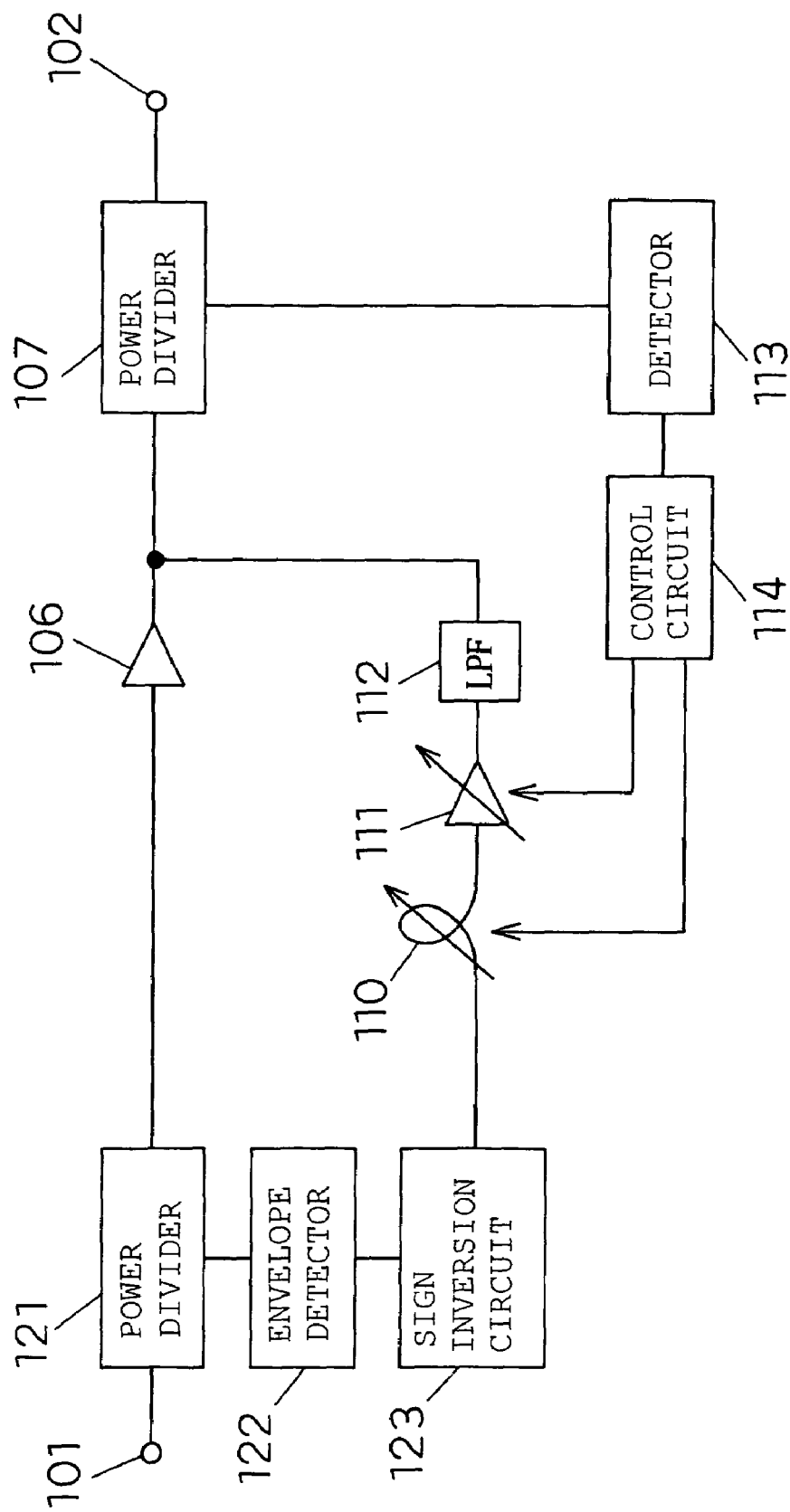
FIG. 9 is a block diagram showing a power amplifier according to Embodiment 3 of the present invention.

FIG. 9 is a block diagram showing a power amplifier according to Embodiment 3 of the present invention. In FIG. 9, reference numeral 121 denotes a power divider, reference numeral 122 denotes an envelope detector, and reference numeral 123 denotes a sign inversion circuit. The other same components as those of Embodiment 1 are indicated by the same reference numerals as FIG. 1. The envelope detector 122 and the sign inversion circuit 123 correspond to an other structural example of inverted envelope generating means of the present invention. As with Embodiment 1, for example, the circuit of FIG. 2 is used for an amplifier 106 and a transistor such as a bipolar transistor is used for a gain variable amplifier 111. A control circuit 114 is constituted of, for example, a memory (storage device) such as a ROM.

In FIG. 9, an input terminal 101 is connected to the input of the power divider 121, and one end of the output of the divider 121 is connected to the input of the amplifier 106. The output of the amplifier 106 is connected to an output terminal 102 via a power divider 107. Meanwhile, the other end of the output of the power divider 121 is connected to the input of the envelope detector 122, and the output of the detector 122 is connected to the output terminal of the amplifier 106 via the sign inversion circuit 123, a variable delay circuit 110, the gain variable amplifier 111, and a low-pass filter 112.

The other end of the output of the power divider 107 is connected to the input of a signal level detector 113, and the output of the detector 113 is connected to the control terminals of the variable delay circuit 110 and the gain variable amplifier 111 via the control circuit 114.

The following will describe the operation of the power amplifier according to the present embodiment. A high-frequency signal modulated by baseband data is inputted to the input terminal 101 of the present embodiment. The signal is divided into two in the power divider 121, and one of the divided outputs is inputted to the amplifier 106. The other divided output from the power divider 121 is inputted to the envelope detector 122, in which an envelope component of the input signal is extracted. The sign of the envelope component is inverted in the sign inversion circuit 123, the delay time and level are adjusted in the variable delay circuit 110 and the gain variable amplifier 111, and a spurious component is removed in the low-pass filter 112. A signal having been subjected to the above processing is injected into the output terminal of the amplifier 106. The subsequent operation is the same as that of Embodiment 1. In this way, while digital IQ signals are used to generate an inverted envelope component in Embodiment 1, the present embodiment is different from Embodiment 1 in that an inverted envelope component is generated from a modulated high-frequency signal.

With the configuration of the present embodiment, a circuit capable of attaining the same effect as Embodiment 1 can comprises only a high-frequency circuit, thereby achieving a more simple circuit configuration and a smaller size as compared with Embodiment 1.

Beside, as with Embodiment 1, both of a modulating signal of a single wave and a modulating signal of a plurality of waves can be reduced in level difference of distortion components occurring on both sides of a signal band in the present embodiment.

Although the gain variable amplifier 111 is used in the present embodiment, when an output level of an envelope generating circuit 108 satisfies a desired level of injection to the amplifier 106, as with Embodiment 1, a variable attenuator 116 can be used instead of the gain variable amplifier as shown in FIG. 5. Also in this case, the same effect can be obtained as the present embodiment.

As with Embodiment 1, the variable delay circuit 110 is used in the present embodiment. A variable phase shifter can be used instead. Also in this case, the same effect can be obtained as the present embodiment.

As with Embodiment 1, the variable delay circuit 110, the gain variable amplifier 111, and the low-pass filter 112 are arranged in this order in the present embodiment. These components can be arranged in any order. Further, although the variable delay circuit 110 is inserted into a path of transmitting an inverted envelope component in this configuration, it is more desirable to insert the variable delay circuit 110 into a path between the power divider 121 and the amplifier 106 in some cases. Also in this case, the same effect can be obtained.

Although the low-pass filter 112 is used in the present embodiment, the filter 112 can be omitted when a spurious band has a sufficient low signal level.

Figure 10:
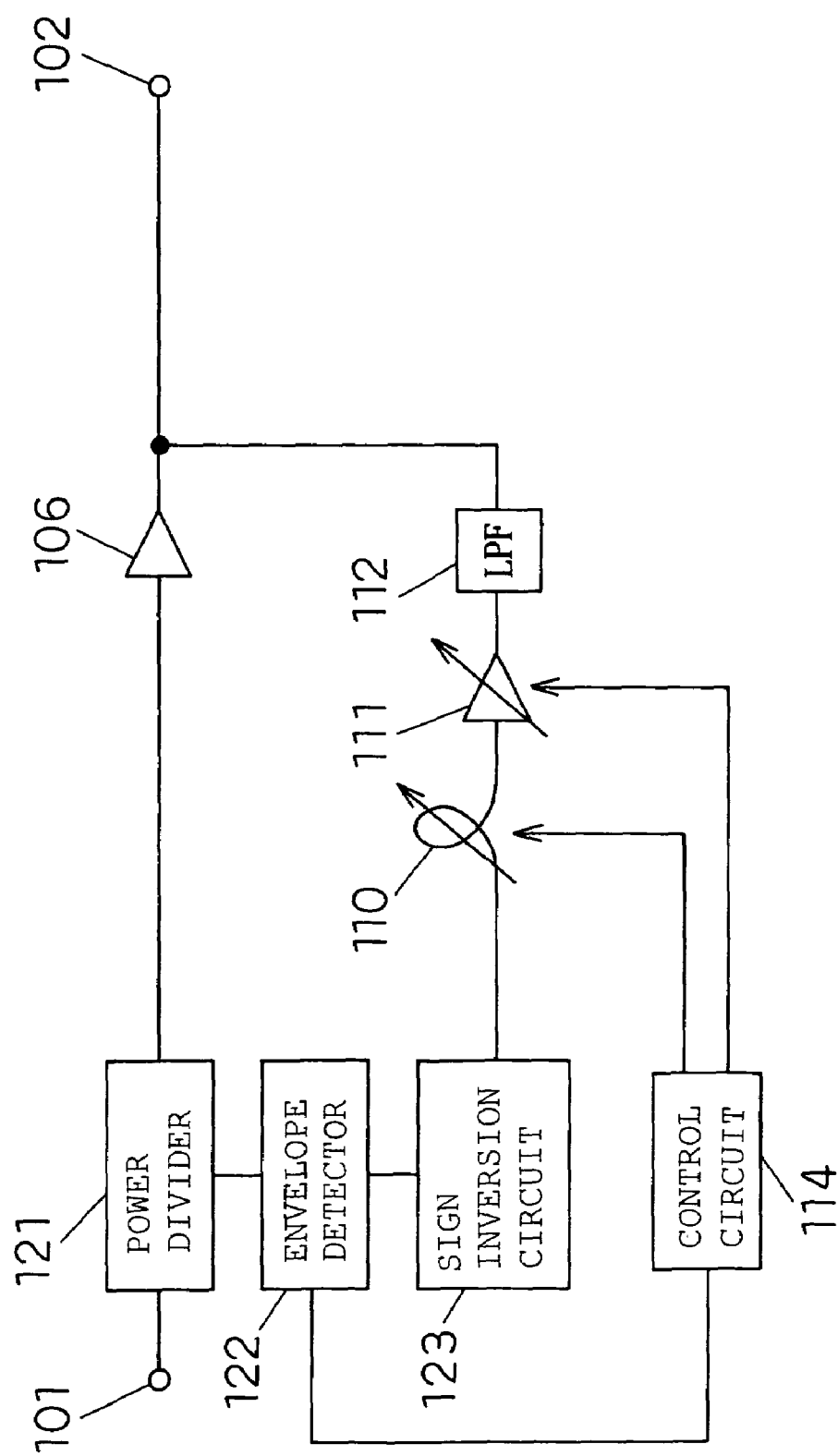
FIG. 10 is a block diagram showing another configuration of the power amplifier according to Embodiment 3 of the present invention.

In the present embodiment, by detecting an output power level in the signal level detector 113, the variable delay circuit 110 and the gain variable amplifier 111 (variable attenuator 116 in the configuration of FIG. 5) are controlled according to the level. It is also possible to adopt the configurations of performing the control described in FIGS. 6 and 7 of Embodiment 1. Furthermore, the configuration of FIG. 10 is also applicable: the output of the envelope detector 122 is partially inputted to the control circuit 114, control voltage is generated according to the level, and the variable delay circuit 110 and the gain variable amplifier 111 (variable attenuator 116 in the configuration of FIG. 5) are controlled by using the control voltage. Namely, the following arrangement is also applicable: a signal level of a high-frequency signal is detected by the envelope detector 122 before the signal is inputted to the amplifier 106, and the variable delay circuit 110, the gain variable amplifier 111, and so on are controlled based on the detected signal. In this case, the envelope detector 122 corresponds to an example of third level detecting means of the present invention. Also in this case, the power divider 107 connected to the output of the amplifier 106 is unnecessary, thereby reducing a loss in the output circuit of the amplifier 106.

(Embodiment 4)

Figure 11:
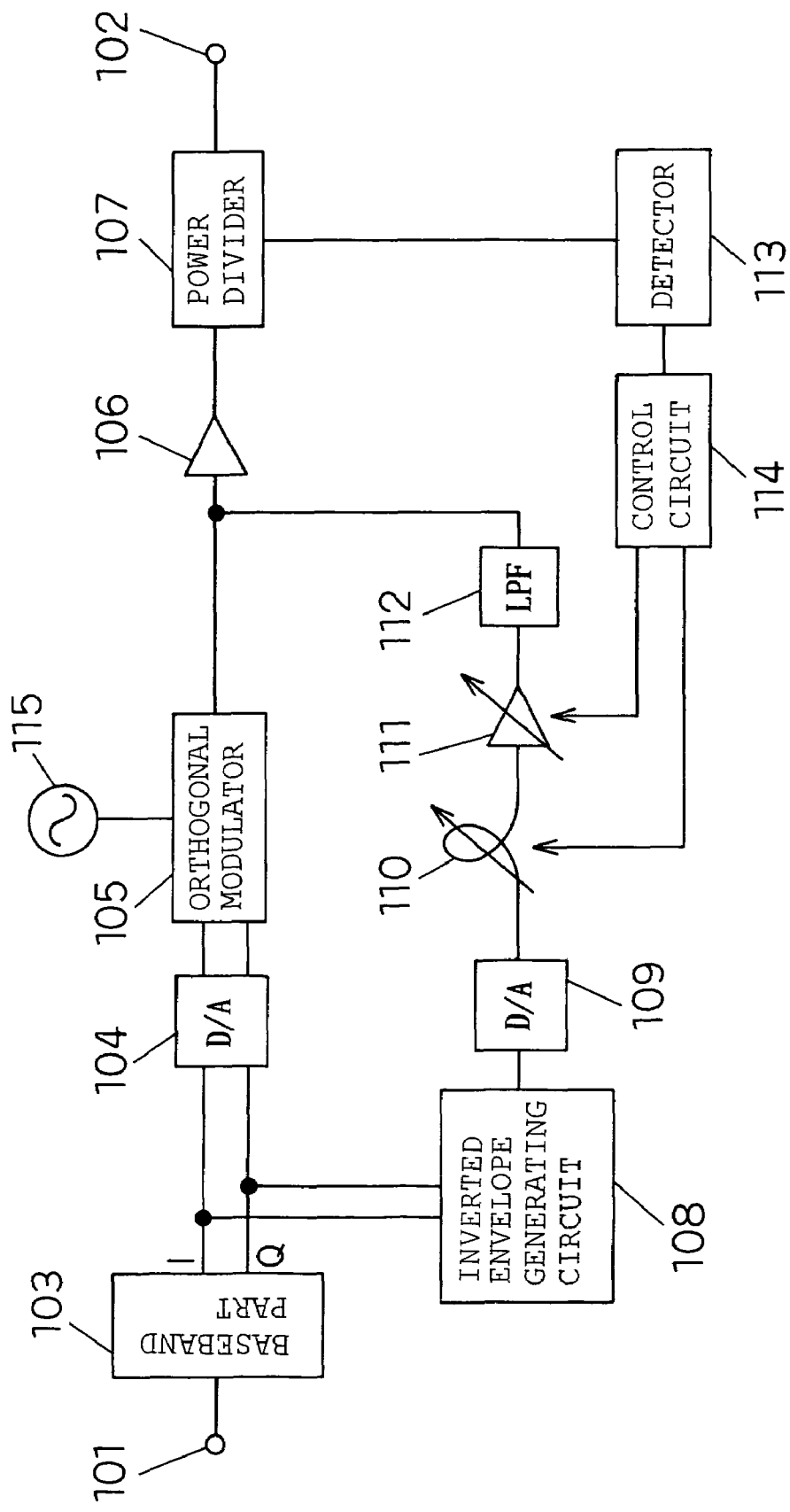
FIG. 11 is a block diagram showing a power amplifier according to Embodiment 4 of the present invention.

FIG. 11 is a block diagram showing a power amplifier according to Embodiment 4 of the present invention. In FIG. 11, the same components as Embodiment 1 are indicated by the same reference numerals of FIG. 1. Only different points from Embodiment 1 will be discussed below.

In Embodiment 1, the output terminal of the low-pass filter 112 is connected to the output terminal of the amplifier 106. In the present embodiment, the output terminal of a low-pass filter 112 is connected to the input terminal of an amplifier 106, and an inverted envelope component generated in an inverted envelope generating circuit 108 is injected into the input terminal of the amplifier 106. Namely, an inverted envelope signal having been adjusted in amplitude or phase is injected to a high-frequency signal before amplification.

With the configuration of the present embodiment, the same effect as Embodiment 1 can be obtained with a lower level of an injected inverted envelope component, resulting in lower power consumption as compared with Embodiment 1.

As with Embodiment 1, both of a modulating signal of a single wave and a modulating signal of a plurality of waves can be reduced in level difference of distortion components occurring on both sides of a signal band in the present embodiment.

As with Embodiment 1, a gain variable amplifier 111 is used in the present embodiment. When an output level of the inverted envelope generating circuit 108 satisfies a desired level of injection to the amplifier 106, as with Embodiment 1, a variable attenuator 116 can be used instead of the gain variable amplifier as shown in FIG. 5. Also in this case, the same effect can be obtained as the present embodiment.

As with Embodiment 1, a variable delay circuit 110 is used in the present embodiment. A variable phase shifter can be used instead. Also in this case, the same effect can be obtained as the present embodiment.

As with Embodiment 1, the variable delay circuit 110, the gain variable amplifier 111, and the low-pass filter 112 are arranged in this order in the present embodiment. These components can be arranged in any order. Further, although the variable delay circuit 110 is inserted into a path of transmitting an inverted envelope component in this configuration, it is more desirable to insert the variable delay circuit 110 into a path between the baseband part 103 and the amplifier 106 in some cases. Also in this case, the same effect can be obtained.

Although the low-pass filter 112 is used in the present embodiment, the low-pass filter 112 can be omitted when a spurious band has a sufficiently low signal level.

In the present embodiment, by detecting an output power level in a signal level detector 113, the variable delay circuit 110 and the gain variable amplifier 111 (variable attenuator 116 in the configuration of FIG. 5) are controlled according to the level. It is also possible to adopt the configurations of performing the control described in FIGS. 6 and 7 of Embodiment 1.

(Embodiment 5)

Figure 12:
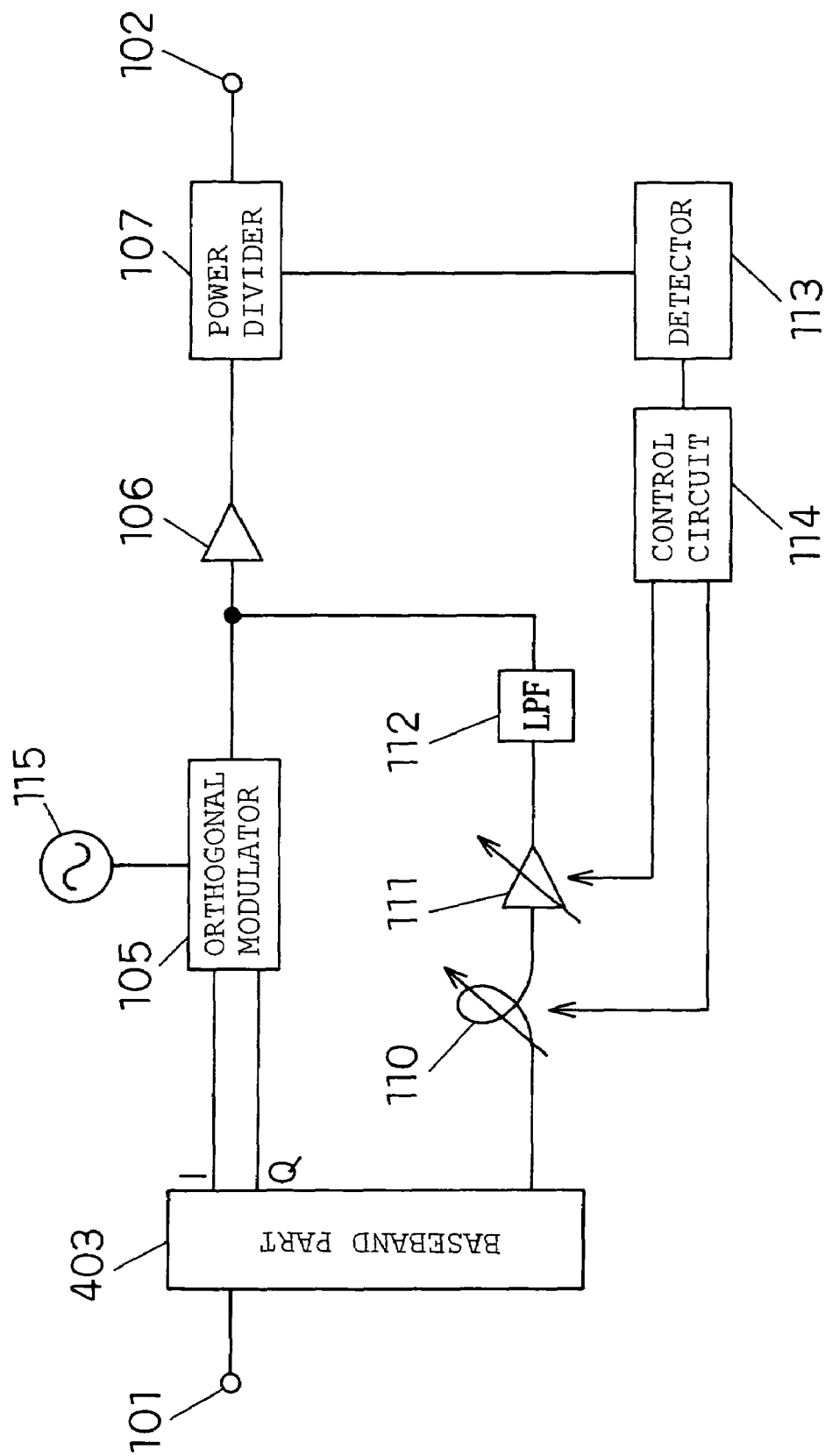
FIG. 12 is a block diagram showing a power amplifier according to Embodiment 5 of the present invention.

FIG. 12 is a block diagram showing a power amplifier according to Embodiment 5 of the present invention. In FIG. 12, the same components as Embodiment 2 are indicated by the same reference numerals of FIG. 8. Only different points from Embodiment 2 will be discussed below.

In Embodiment 2, the output terminal of the low-pass filter 112 is connected to the output terminal of the amplifier 106. In the present embodiment, the output terminal of a low-pass filter 112 is connected to the input terminal of an amplifier 106, and an inverted envelope component generated in a baseband part 403 is injected into the input terminal of the amplifier 106.

With the configuration of the present embodiment, the same effect as Embodiment 2 can be obtained with a lower level of an injected inverted envelope component, resulting in lower power consumption as compared with Embodiment 2.

As with Embodiment 2, both of a modulating signal of a single wave and a modulating signal of a plurality of waves can be reduced in level difference of distortion components occurring on both sides of a signal band in the present embodiment.

As with Embodiment 2, a gain variable amplifier 111 is used in the present embodiment. When an output level of an inverted envelope component from the baseband part 403 satisfies a desired level of injection to the amplifier 106, as with Embodiment 2, a variable attenuator 116 can be used instead of the gain variable amplifier as shown in FIG. 5. Also in this case, the same effect can be obtained as the present embodiment.

As with Embodiment 2, a variable delay circuit 110 is used in the present embodiment. A variable phase shifter can be used instead. Also in this case, the same effect can be obtained as the present embodiment.

As with Embodiment 2, the variable delay circuit 110, the gain variable amplifier 111, and the low-pass filter 112 are arranged in this order in the present embodiment. These components can be arranged in any order. Further, although the variable delay circuit 110 is inserted into a path of transmitting an inverted envelope component in this configuration, it is more desirable to insert the circuit 110 into a path between the baseband part 403 and the amplifier 106 in some cases. Also in this case, the same effect can be obtained.

Although the low-pass filter 112 is used in the present embodiment, the low-pass filter 112 can be omitted when a spurious band has a sufficiently low signal level.

In the present embodiment, by detecting an output power level in a signal level detector 113, the variable delay circuit 110 and the gain variable amplifier 111 (variable attenuator 116 in the configuration of FIG. 5) are controlled according to the level. It is also possible to adopt the configurations of performing the same control described in FIGS. 6 and 7 of Embodiment 1.

(Embodiment 6)

Figure 13:
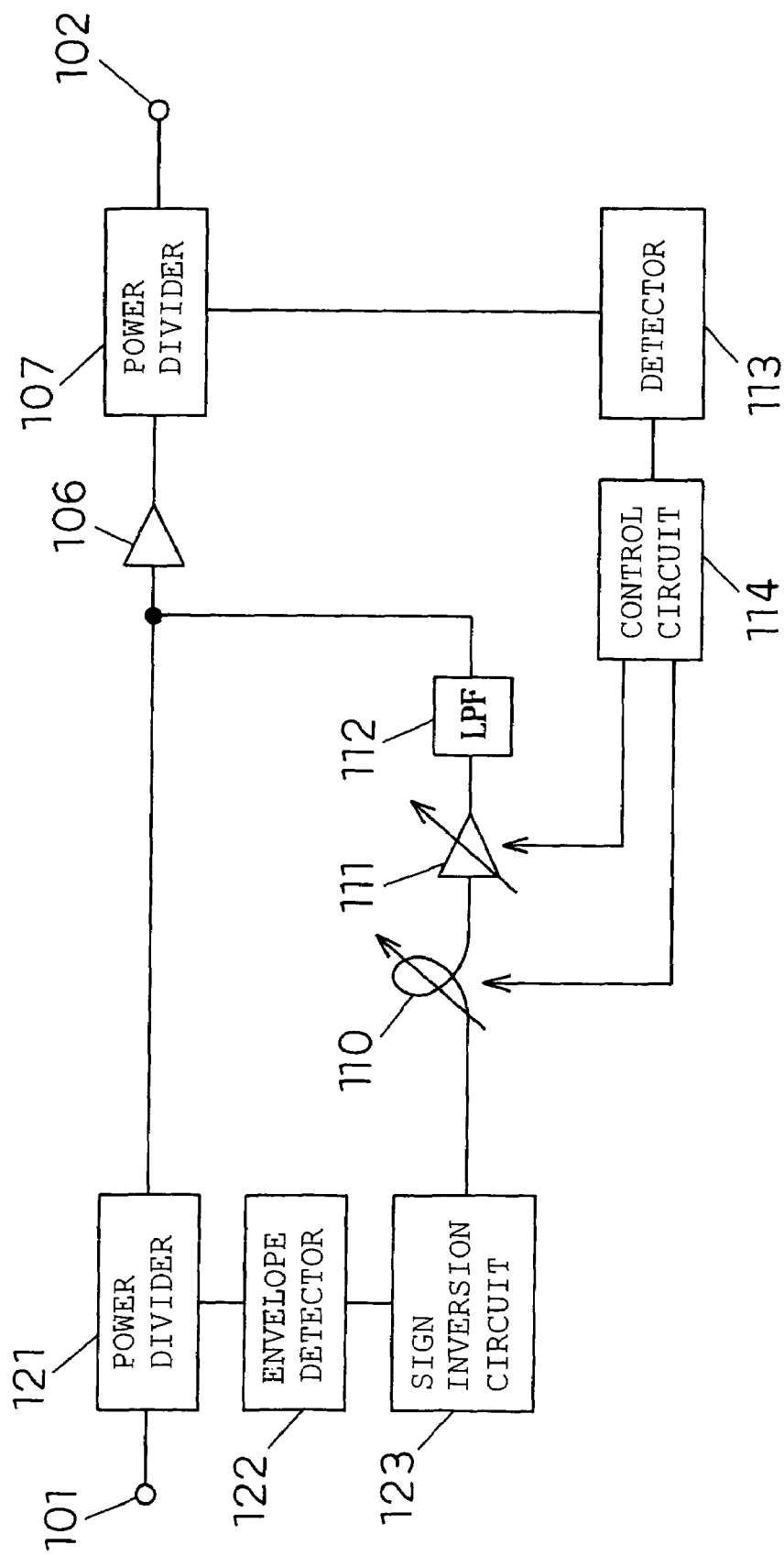
FIG. 13 is a block diagram showing a power amplifier according to Embodiment 6 of the present invention.

FIG. 13 is a block diagram showing a power amplifier according to Embodiment 6 of the present invention. In FIG. 13, the same components as Embodiment 3 are indicated by the same reference numerals of FIG. 9. only different points from Embodiment 3 will be described below.

In Embodiment 3, the output terminal of the low-pass filter 112 is connected to the output of the amplifier 106. In the present embodiment, the output terminal of a low-pass filter 112 is connected to the output terminal of an amplifier 106 and inverted envelope components generated in an envelope detector 122 and a sign inversion circuit 123 are injected into the input terminal of the amplifier 106.

With the configuration of the present embodiment, the same effect as Embodiment 3 can be obtained with a lower level of an injected inverted envelope component, resulting in lower power consumption as compared with Embodiment 3.

As with Embodiment 3, both of a modulating signal of a single wave and a modulating signal of a plurality of waves can be reduced in level difference of distortion components occurring on both sides of a signal band in the present embodiment.

As with Embodiment 3, a gain variable amplifier 111 is used in the present embodiment. When an output level of an inverted envelope component from the sign inversion circuit 123 satisfies a desired level of injection to the amplifier 106, as with Embodiment 3, a variable attenuator 116 can be used instead of the gain variable amplifier as shown in FIG. 5. Also in this case, the same effect can be obtained as the present embodiment.

As with Embodiment 3, a variable delay circuit 110 is used in the present embodiment. A variable phase shifter can be used instead. Also in this case, the same effect can be obtained as the present embodiment.

As with Embodiment 3, the variable delay circuit 110, the gain variable amplifier 111, and the low-pass filter 112 are arranged in this order in the present embodiment. These components can be arranged in any order. Further, although the variable delay circuit 110 is inserted into a path of transmitting an inverted envelope component in this configuration, it is more desirable to insert the circuit 110 into a path between a power divider 121 and the amplifier 106 in some cases. Also in this case, the same effect can be obtained.

Although the low-pass filter 112 is used in the present embodiment, the low-pass filter 112 can be omitted when a spurious band has a sufficiently low signal level.

In the present embodiment, by detecting an output level in a signal level detector 113, the variable delay circuit 110 and the gain variable amplifier 111 (variable attenuator 116 in the configuration of FIG. 5) are controlled according to the level. It is also possible to adopt the configurations of performing the same control described in FIGS. 6, 7, and 10 of Embodiment 3.

(Embodiment 7)

Figure 14:
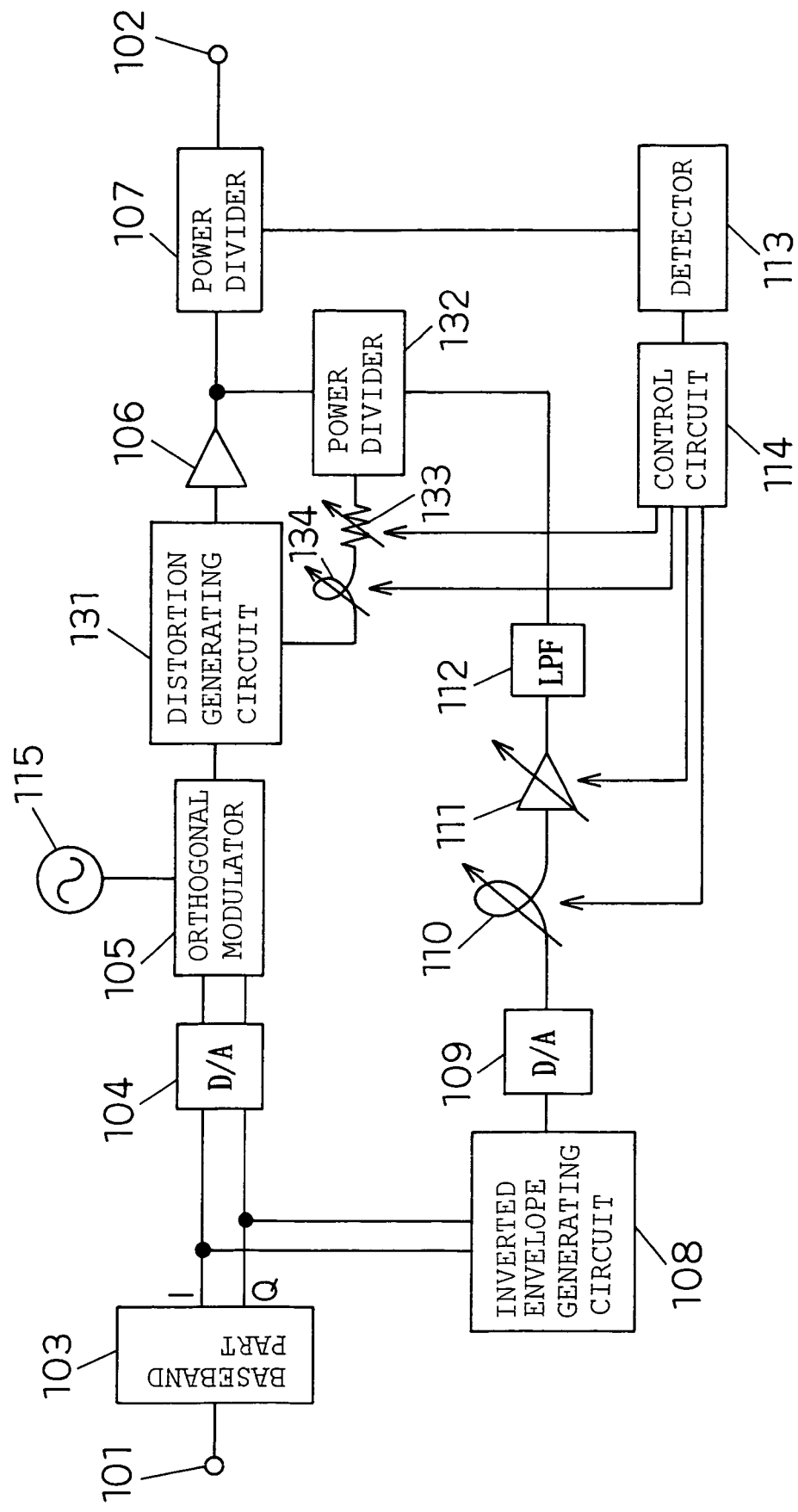
FIG. 14 is a block diagram showing a power amplifier with predistortion compensation according to Embodiment 7 of the present invention.

FIG. 14 is a block diagram showing a power amplifier with predistortion compensation according to Embodiment 7 of the present invention. In FIG. 14, the same components as Embodiment 1 are indicated by the reference numerals of FIG. 1. Only different points from Embodiment 1 will be described below.

In the present embodiment, a distortion generating circuit 131 is inserted between an orthogonal modulator 105 and an amplifier 106. The output of an inverted envelope generating circuit 108 is connected to the input of a power amplifier 132 via a D/A converter 109, a variable delay circuit 110, a gain variable amplifier 111, and a low-pass filter 112. One end of the output of the power divider 132 is connected to the output terminal of the amplifier 106, and the other end of the output of the power divider 132 is connected to the distortion generating circuit 131 via a variable attenuator 133 serving as an example of second amplitude adjusting means of the present invention and a variable delay circuit 134 serving as an example of second phase adjusting means of the present invention. The other components are the same as those of Embodiment 1. Namely, in the power amplifier of the present embodiment, a predistortion compensating function such as the distortion generating circuit 131, the variable attenuator 133, and the variable delay circuit 134 is added to the power amplifier of Embodiment 1.

Figure 15:
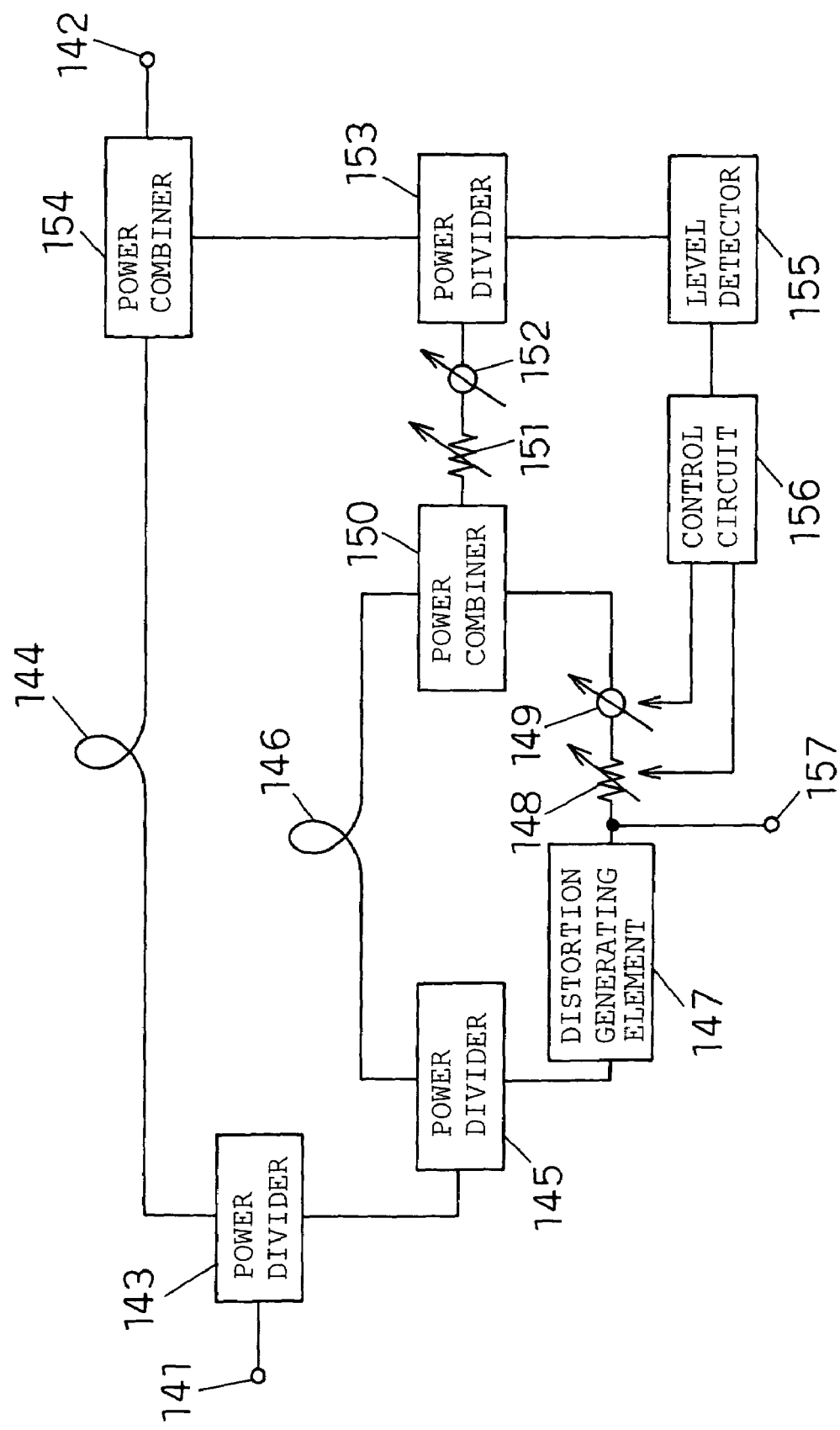
FIG. 15 is a block diagram showing a distortion generating circuit in the power amplifier with predistortion compensation according to Embodiment 7 of the present invention.

Referring to FIG. 15, the configuration of the distortion generating circuit 131 will be described according to the present embodiment.

FIG. 15 is a block diagram showing the distortion generating circuit 131. The distortion generating circuit of FIG. 15 comprises an input terminal 141, an output terminal 142, power dividers 143, 145, and 153, delay circuits 144 and 146, a distortion generating element 147, variable attenuators 148 and 151, variable phase shifters 149 and 152, power combiners 150 and 154, a signal level detector 155, a control circuit 156, and a control terminal 157. For the distortion generating element 147, for example, a transistor such as a field-effect transistor (FET) is used.

In FIG. 15, the input terminal 141 is connected to the input of the power divider 143, and one end of the output of the power divider 143 is connected to one end of the input of the power combiner 154 via the delay circuit 144. Meanwhile, the other end of the output of the power divider 143 is connected to the input of the power divider 145, and one end of the output of the power divider 145 is connected to one end of the input of the power combiner 150 via the delay circuit 146. Meanwhile, the other end of the output of the power divider 145 is connected to the input of the distortion generating element 147. The output of the distortion generating element 147 is connected to the other end of the input of the power combiner 150 via the variable attenuator 148 and the variable phase shifter 149.

The output of the power combiner 150 is connected to the input of the power divider 153 via the variable attenuator 151 and the variable phase shifter 152. One end of the output of the power divider 153 is connected to the other end of the input of the power combiner 154. The output of the power combiner 154 is connected to the output terminal 142. Meanwhile, the other end of the output of the power divider 153 is connected to the input of the signal level detector 155, and the output of the detector 155 is connected to the control terminals of the variable attenuator 148 and the variable phase shifter 149 via the control circuit 156. Further, a signal from the variable delay circuit 134 of FIG. 14 is inputted to the control terminal 157.

The following will describe the operation of the power amplifier with predistortion compensation according to the present embodiment. In the present embodiment, the condition of an input signal is the same as Embodiment 1.

Figure 16:
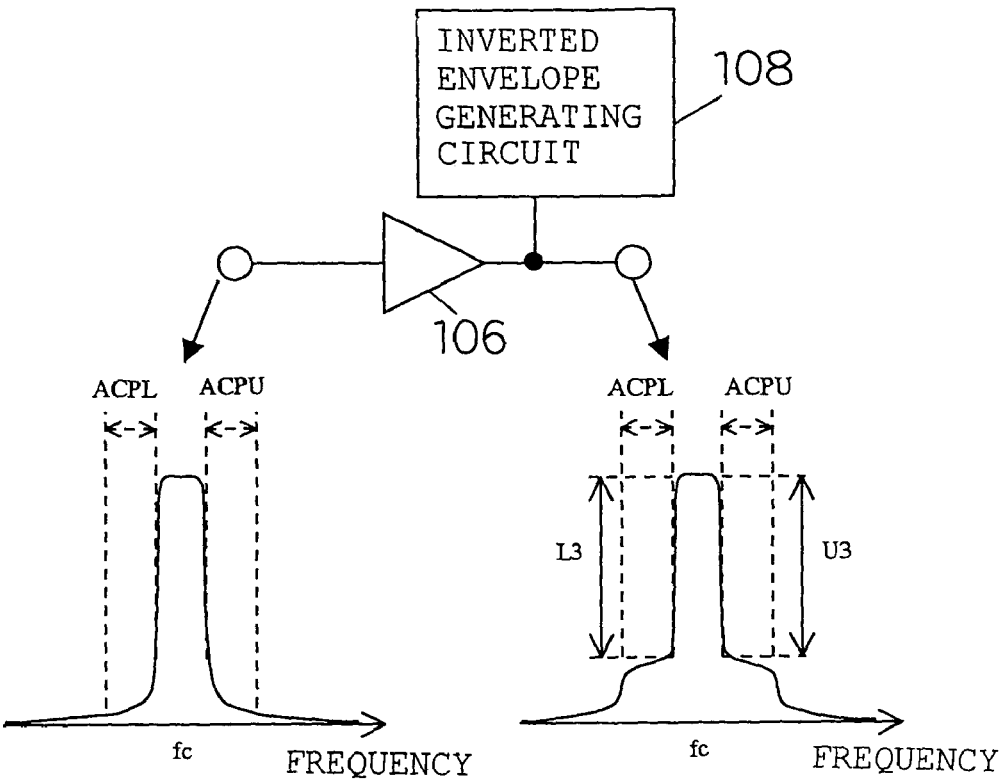
FIG. 16(a) is a diagram showing operation of an amplifier alone in the power amplifier with predistortion compensation according to Embodiment 7 of the present invention.
FIG. 16(b) is a diagram showing operation of the power amplifier with predistortion compensation according to Embodiment 7 of the present invention.
Figure 16:
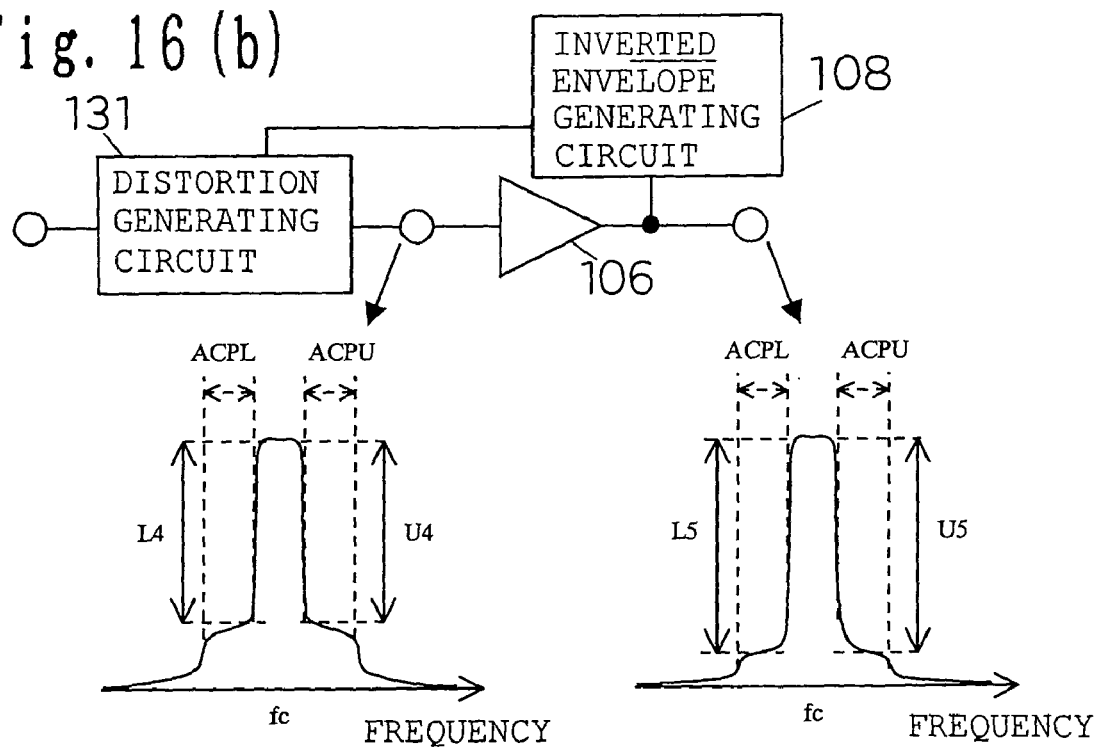

FIG. 16(*a*) is a diagram showing the operation performed by the amplifier 106 alone of the present embodiment. As with Embodiment 1, when a signal modulated as FIG. 16(*a*) is inputted to the amplifier 106 having an inverted envelope component injected into the output terminal, a level difference appearing in the output between ACPL and ACPU almost disappears (L3=U3).

Meanwhile, FIG. 16(*b*) is a diagram showing the operation of the present embodiment. In the present embodiment, since a distortion component is generated in the distortion generating circuit 131, a spectrum of a signal inputted to the amplifier 106 includes a signal component and a distortion component as shown in FIG. 16(*b*). An inverted envelope component generated in the inverted envelope generating circuit 108 is injected also to the output terminal of the distortion generating element 147 in the distortion generating circuit 131. Thus, as shown in FIG. 16(*b*), a level difference between ACPL and ACPU in the distortion generating circuit 131 almost disappears (L4=U4).

As a result, regarding distortion generated in the distortion generating circuit 131 and distortion generated in the amplifier 106, a level difference between ACPL and ACPU almost disappears. In this way, a distortion component inputted to the amplifier 106 is caused to be equal in amplitude to a distortion component generated in the amplifier 106 in opposite phase, so that as shown in FIG. 16(*b*), it is possible to obtain a distortion suppressing amount which is larger than that of Embodiment 1 by 10 dB or more (U5−U3).

By connecting a predistortion compensating circuit to the amplifier in this manner, it is possible to achieve large distortion suppression as compared with the amplifier alone by 18 dB or more and to achieve a twofold or more increase in power efficiency of the whole amplifier.

An output signal amplified in the amplifier 106 is divided into two in the power divider 107, one of the output signals is subjected to level detection in the signal level detector 113, and the detected signal is inputted to the control circuit 114. A control voltage is outputted from the control circuit 114 according to the input level, and the control voltage is inputted to the control terminals of the variable delay circuits 110 and 134, the gain variable amplifier 111, and the variable attenuator 133 to control delay time of the variable delay circuits 110 and 134, the gain of a gain variable amplifier 111, and an attenuation of the variable attenuator 133. With this configuration, even when an operating point (output power level) of the amplifier 106 is changed, it is possible to perform control so as to optimize the delay time and the levels of inverted envelope components injected into the output terminal of the amplifier 106 and the output terminal of the distortion generating element 147 in the distortion generating circuit 131.

Figure 17:
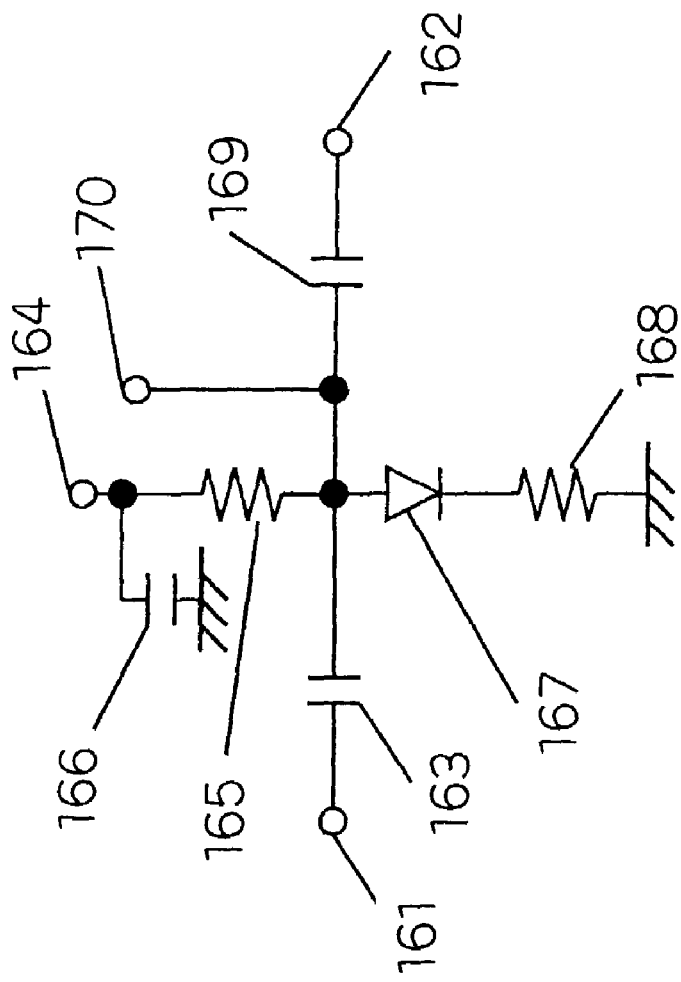
FIG. 17 is a circuit diagram showing another configuration of a distortion generating circuit in the power amplifier with predistortion compensation according to Embodiment 7 of the present invention.

The configuration of FIG. 15 is used as the distortion generating circuit in the present embodiment. Another configuration of FIG. 17 is also applicable. FIG. 17 shows an example of the distortion generating circuit 131 according to another embodiment. In this circuit, distortion is generated in a diode 167 relative to a signal inputted from an input terminal 161, and the distortion is taken out from an output terminal 162. Reference numeral 164 denotes a power supply terminal which applies bias to the diode 167. Reference numeral 170 denotes a control terminal which receives a signal (inverted envelope component of an input signal to the amplifier 106) from the variable delay circuit 134 shown in FIG. 14. Even with the distortion generating circuit configured thus, the same effect can be obtained as the present embodiment.

Figure 18:
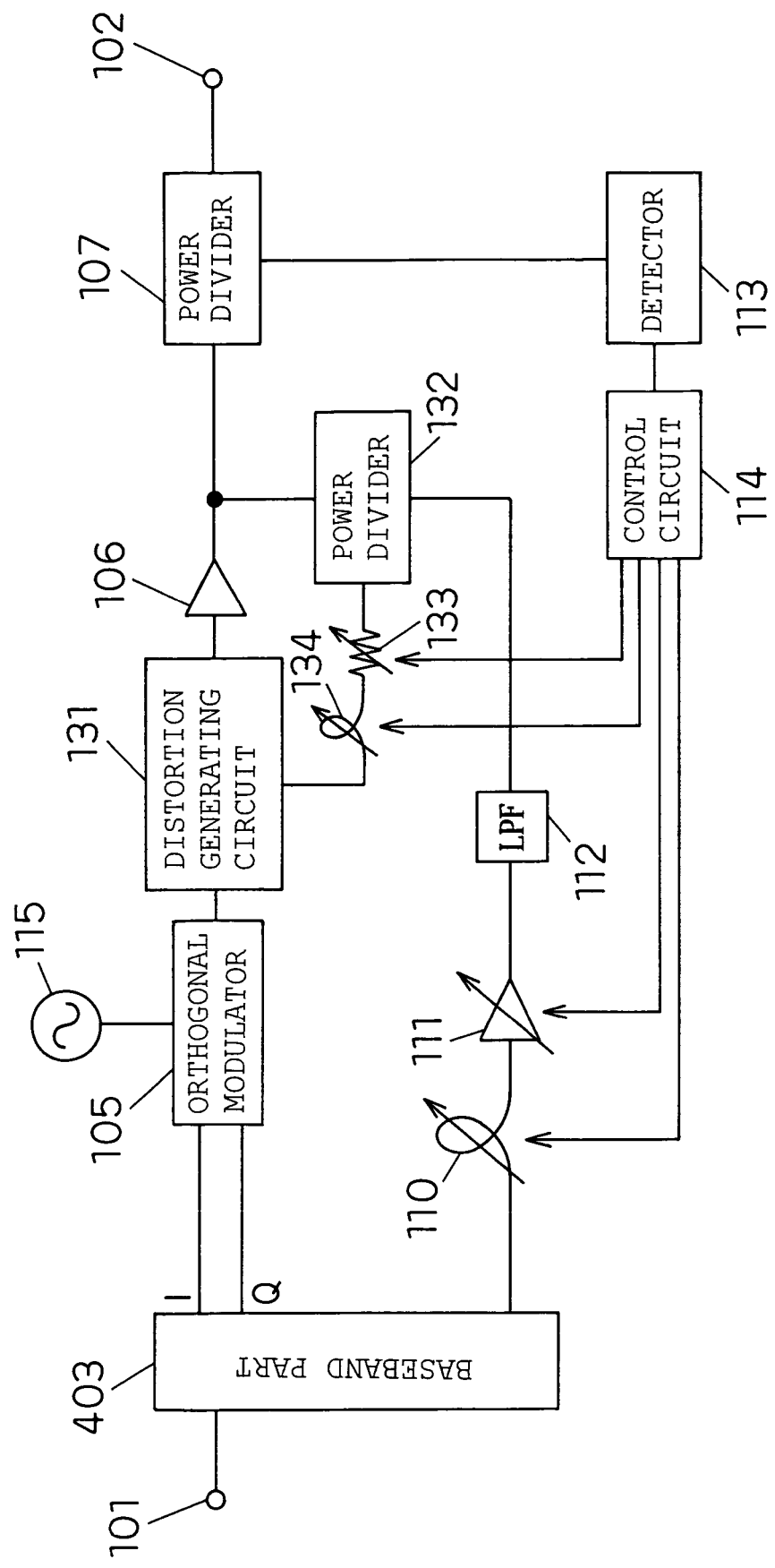
FIG. 18 is a block diagram showing another configuration of the power amplifier with predistortion compensation according to Embodiment 7 of the present invention.
Figure 19:
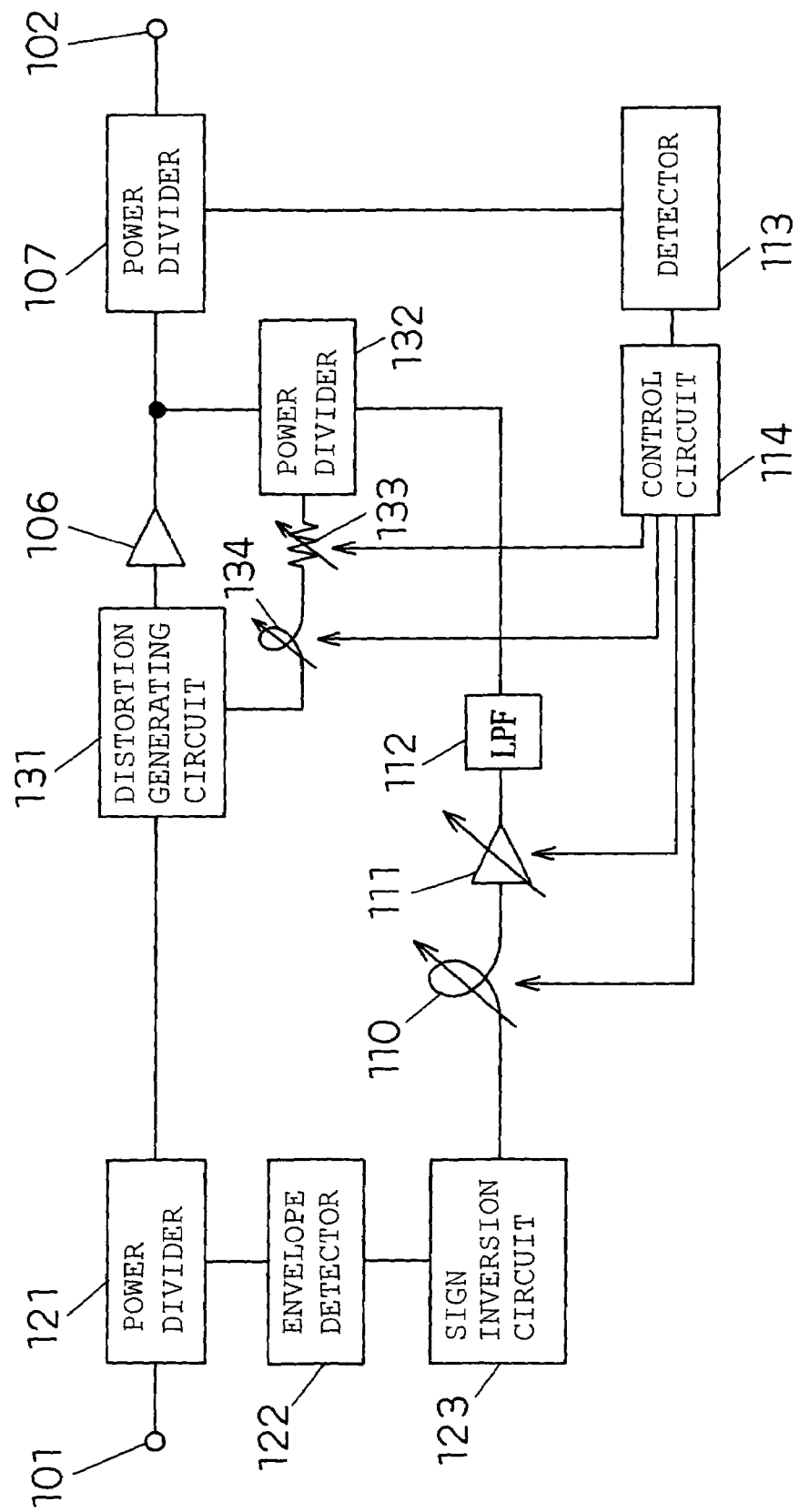
FIG. 19 is a block diagram showing another configuration of the power amplifier with predistortion compensation according to Embodiment 7 of the present invention.

In the present embodiment, the block structure of Embodiment 1 is used as a basic structure and the distortion generating circuit 131 is inserted into the structure. The distortion generating circuit 131 may be inserted into the configuration of Embodiment 2 or 3 as shown in FIGS. 18 and 19.

In the present embodiment, an inverted envelope component is injected into the output terminals of the distortion generating element 147 and the amplifier 106. An inverted envelope component can be also injected into one or both of the input terminals. This also holds true for the block diagrams shown in FIGS. 18 and 19.

In the present embodiment, an inverted envelope component is injected into both of the output terminals of the distortion generating element 147 and the amplifier 106. An inverted envelope component can be inputted to only one of the output terminals. For example, when ACPL and ACPU generated in the amplifier 106 has a level difference but ACPL and ACPU generated in the distortion generating circuit 131 hardly have a level difference, an inverted envelope component can be also inputted only to the amplifier 106. Also in this case, the same effect can be obtained as the present embodiment.

The present embodiment discussed a modulating signal of a single wave as an example. Even when a modulating signal has a plurality of waves, the same operation is performed and thus the same effect is obtained.

As with the foregoing embodiments, the gain variable amplifier 111 is used in the present embodiment. When the output level of an inverted envelope component from the inverted envelope generating circuit 108 satisfies a desired level of injection to the amplifier 106, the variable attenuator can be used instead of the gain variable amplifier 111. Also in this case, the same effect can be obtained as the present embodiment.

As with the foregoing embodiments, the variable delay circuits 110 and 134 are used in the present embodiment. The variable phase shifter can be used instead of one or both of the delay circuits. Also in this case, the same effect can be obtained as the present embodiment.

As with the foregoing embodiments, the variable delay circuit 110, the gain variable amplifier 111, and the low-pass filter 112 are arranged in this order in the present embodiment. These components can be arranged in any order. Similarly, the order of the variable attenuator 133 and the variable delay circuit 134 is not limited. Further, although the variable delay circuit 110 is inserted into a path of transmitting an inverted envelope component in this configuration, it is more desirable to insert the circuit 110 into a path between the power divider 121 and the amplifier 106 in some cases. Also in this case, the same effect can be obtained.

Although the low-pass filter 112 is used in the present embodiment, the low-pass filter 112 can be omitted when a spurious band has a sufficiently low signal level.

Figure 20:
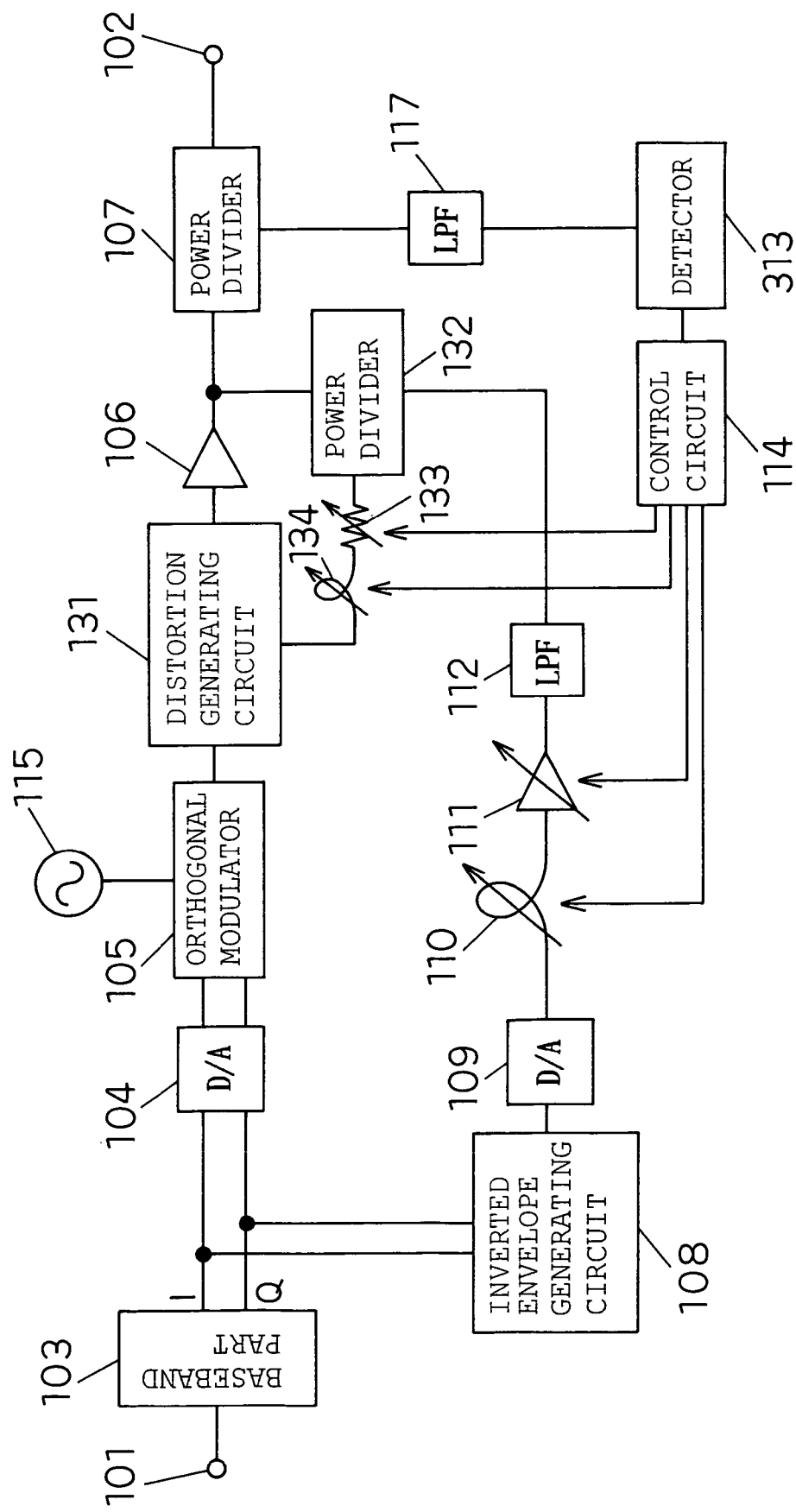
FIG. 20 is a block diagram showing another configuration of the power amplifier with predistortion compensation according to Embodiment 7 of the present invention.
Figure 21:
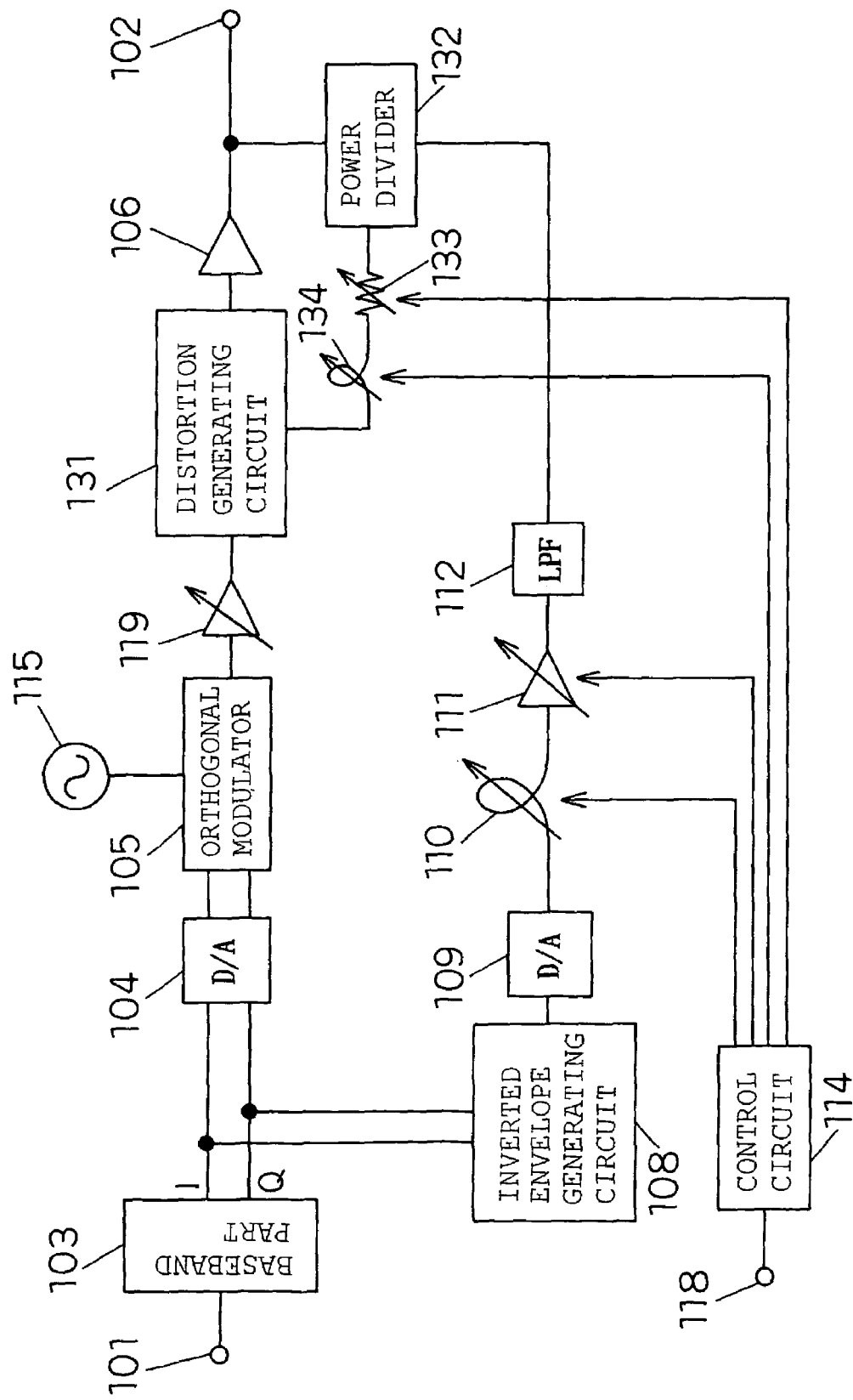
FIG. 21 is a block diagram showing another configuration of the power amplifier with predistortion compensation according to Embodiment 7 of the present invention.
Figure 22:
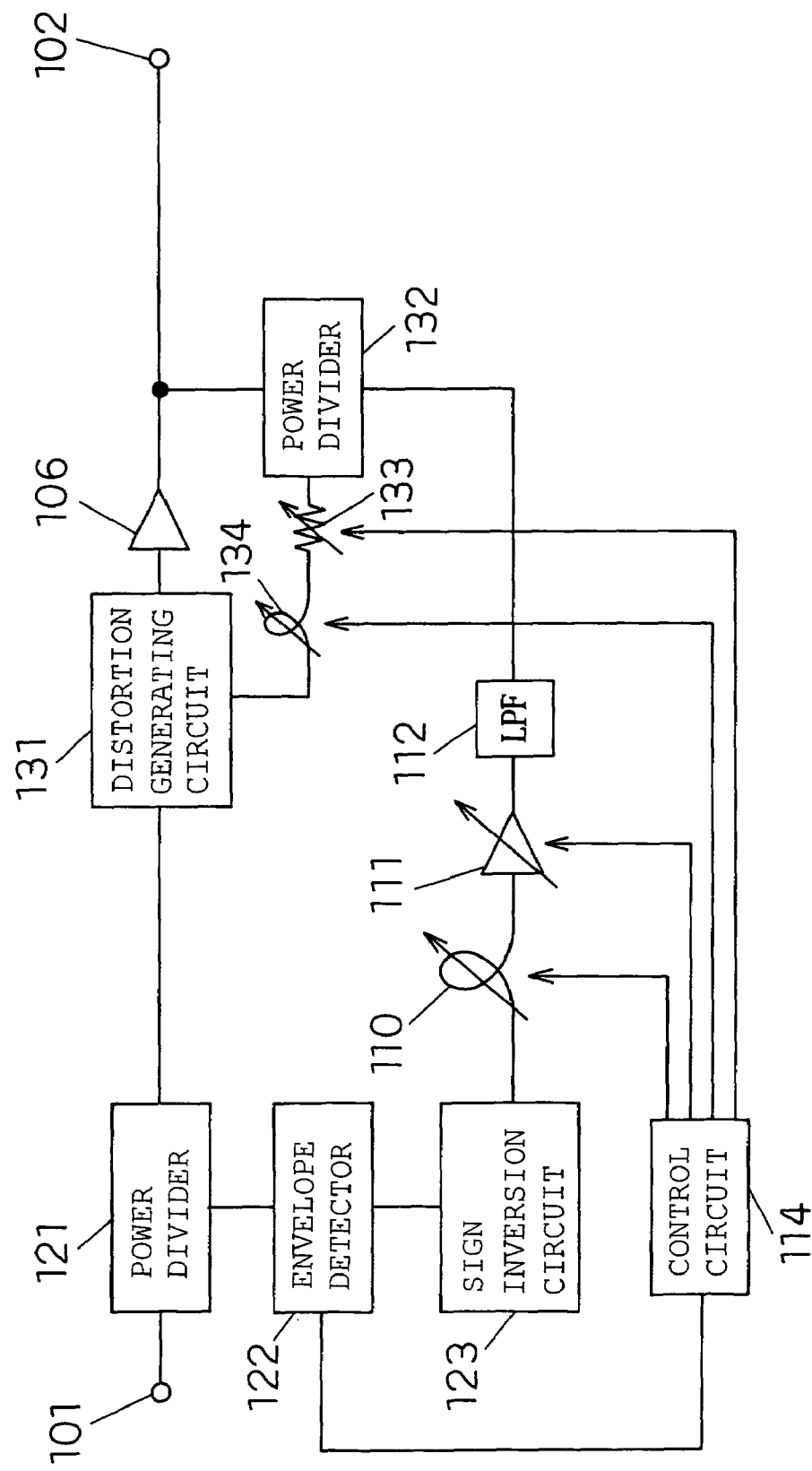
FIG. 22 is a block diagram showing another configuration of the power amplifier with predistortion compensation according to Embodiment 7 of the present invention.

In the present embodiment, by detecting an output power level in the signal level detector 113, the variable delay circuit 110, the gain variable amplifier 111 (or the variable attenuator), the variable delay circuit 134, and the variable attenuator 133 are controlled according to the level. As described in Embodiments 1 and 3, it is also possible to adopt the configuration in which a low-frequency component of an output signal is detected by the low-pass filter 117 of FIG. 20 and the component is used to perform control, the configuration in which information about an output power level of FIG. 21 or a gain of the gain variable amplifier 119 is acquired in advance from the control signal terminal 118 and the information is used to perform control, or the configuration in which a part of the output of the envelope detector 122 shown in FIG. 22 is used to perform control. In this case, the operating principles of these circuits are the same as those of FIGS. 6, 7, and 10 that are described in Embodiments 1 and 3.

(Embodiment 8)

Figure 23:
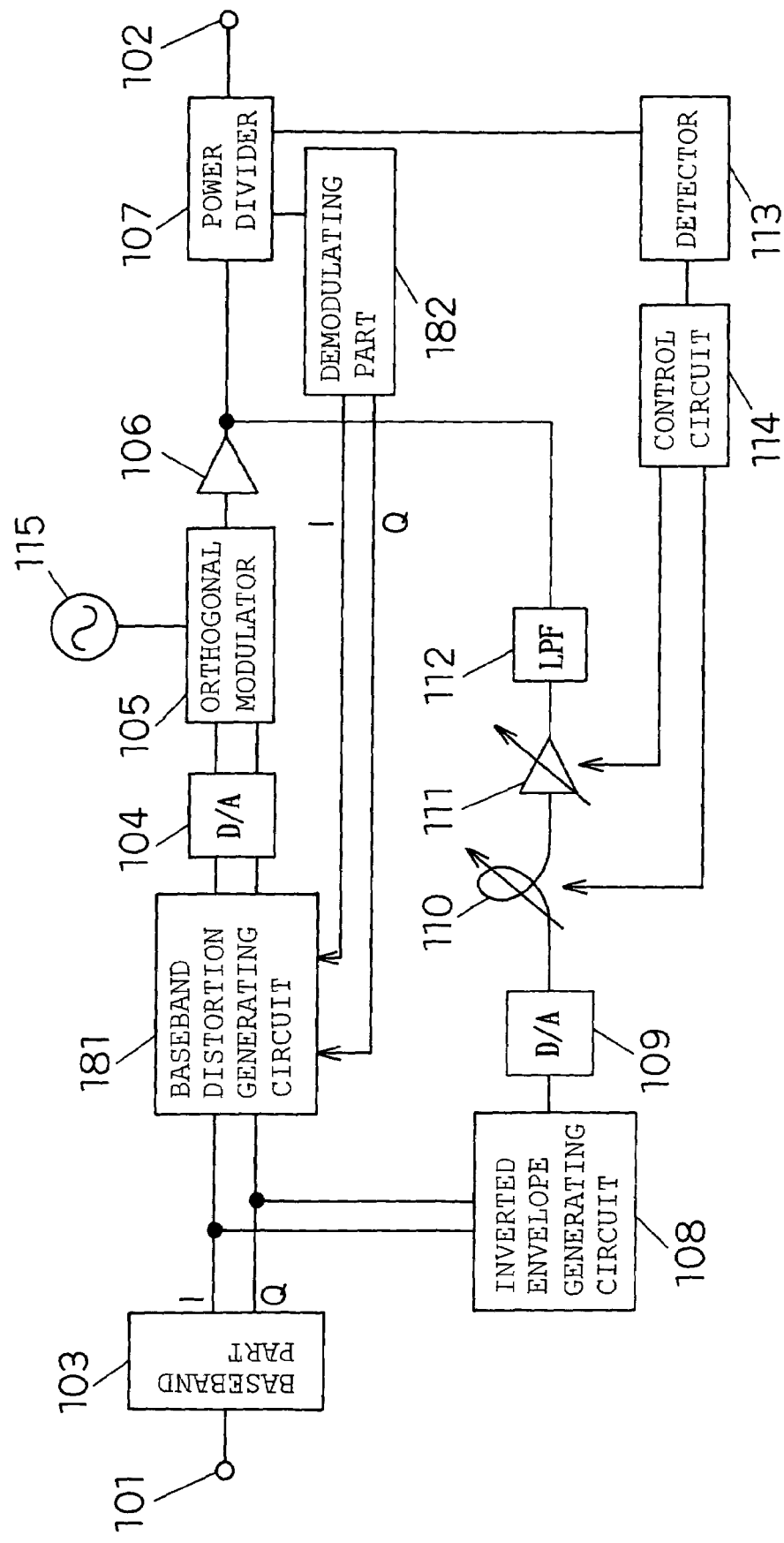
FIG. 23 is a block diagram showing a power amplifier with predistortion compensation according to Embodiment 8 of the present invention.

FIG. 23 is a block diagram showing a power amplifier with predistortion compensation according to Embodiment 8 of the present invention. In FIG. 23, the same components as Embodiment 7 are indicated by the same reference numerals of FIG. 14. Only different points from Embodiment 7 will be described below.

In Embodiment 7, a signal having been subjected to orthogonal modulation in the orthogonal modulator 105 is used to generate a distorted signal in the distortion generating circuit 131, and the signal is inputted into the amplifier 106. The present embodiment is different from Embodiment 7 in that a baseband distortion generating circuit 181 serving as an example of a distortion generating circuit of the present invention is connected to the output of a baseband part 103 and a demodulator 182 is provided which serves as an example of a demodulating part of the present invention to demodulate an amplified high-frequency signal acquired from a power divider 107 into an I signal and a Q signal.

The following will describe the operation of the power amplifier with predistortion compensation according to the present embodiment configured thus. Also in the present embodiment, the conditions of an input signal are the same as Embodiment 1.

IQ signals are generated in the baseband part 103 according to digital data inputted to an input terminal 101. One of the signal is inputted to the baseband distortion generating circuit 181 and other signal is inputted to an inverted envelope generating circuit 108. Thereafter, the signal inputted to the inverted envelope generating circuit is operated in the same manner as Embodiment 7.

Meanwhile, the IQ signal inputted to the baseband distortion generating circuit 181 is converted so as to generate distortion when conversion is made into a high-frequency signal in an orthogonal modulator 105. Namely, the baseband distortion generating circuit 181 converts the inputted IQ signal so that a distorted signal for canceling a distortion component is included in a signal inputted to an amplifier 106, the distortion component being generated when the signal is amplified in the amplifier 106. Namely, based on the I signal and Q signal generated in the baseband part 103 and the I signal and Q signal outputted from the demodulator 182, the baseband distortion generating circuit 181 generates a distorted signal for canceling distortion in a high-frequency signal amplified by the amplifier 106. The IQ signal converted in the baseband distortion circuit 181 will be referred to as a distorted IQ signal.

When the distorted IQ signal is modulated in the orthogonal modulator 105, the output is identical to the spectrum in the output of the distortion generating circuit 131 shown in FIG. 16($b$) of Embodiment 7. Namely, the output obtained by modulating the distorted IQ signal in the orthogonal modulator 105 becomes a spectrum including a component which is equal in amplitude in opposite phase to distortion generated when the original IQ signal having been subjected to orthogonal modulation is amplified in the amplifier 106. ACPL and ACPU are at the same level. Thereafter, as shown in FIG. 16(*b*), a signal having a suppressed distortion component is acquired from the output of the amplifier 106 according to the same operating principle as that of Embodiment 7.

An output signal from the amplifier 106 is divided into three in the power divider 107, and one of the divided signals is inputted to the demodulator 182. In the demodulator 182, the inputted signal is demodulated into an IQ signal. The demodulated IQ signal is inputted to the baseband distortion generating circuit 181 and is compared with the IQ signal generated in the baseband part 103, and the IQ signal outputted from the baseband distortion generating circuit 181 is changed based on the results.

As described above, the same effect as Embodiment 7 can be obtained in the present embodiment. Further, since the levels of ACPL and ACPU generated by the output of the orthogonal modulator 105 are always equal in the present embodiment, unlike the foregoing embodiments, it is possible to eliminate the necessity for injecting an inverted envelope component into a distortion generating element 147.

Figure 24:
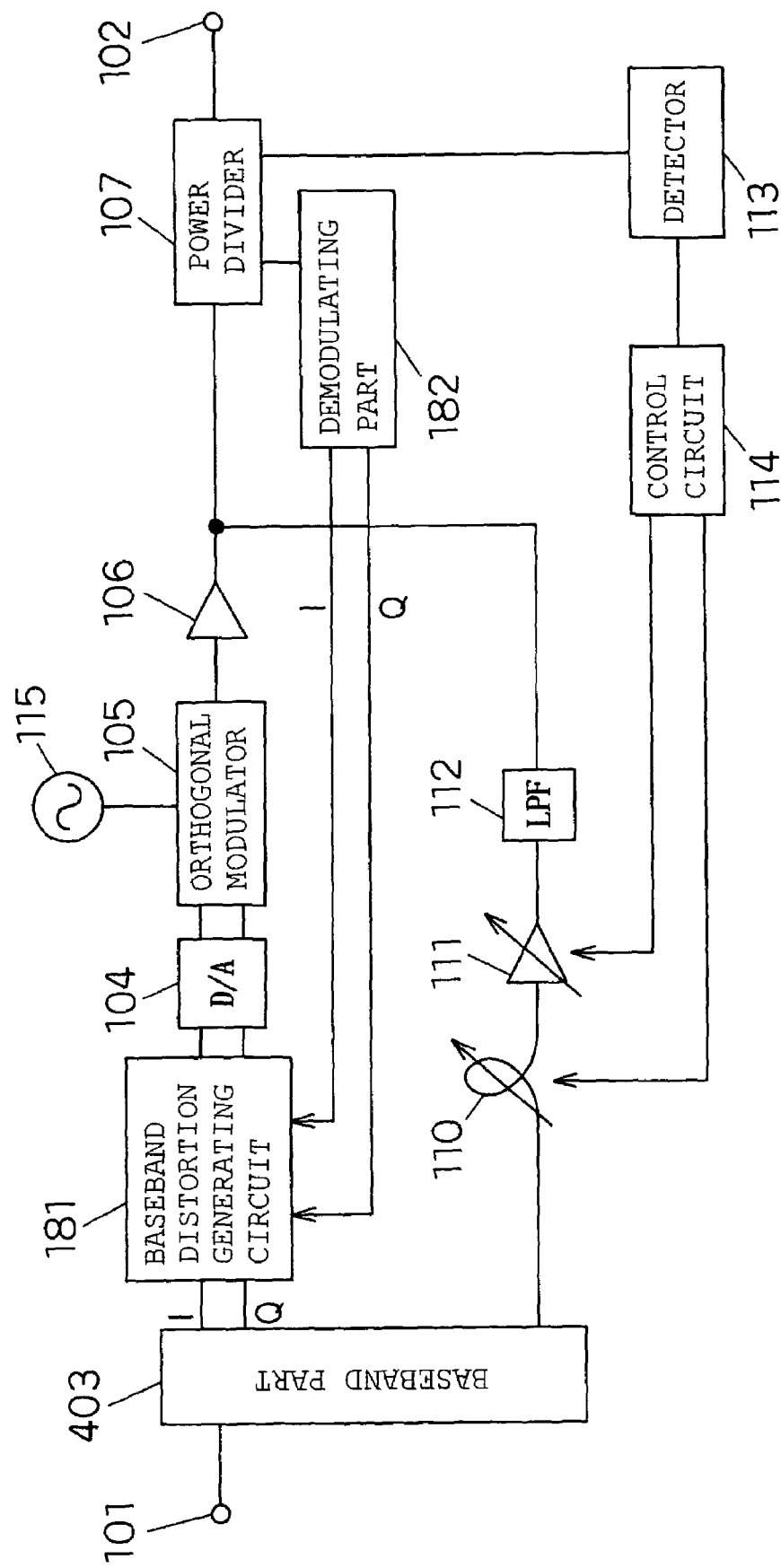
FIG. 24 is a block diagram showing another configuration of a power amplifier with predistortion compensation according to Embodiment 8 of the present invention.
Figure 25:
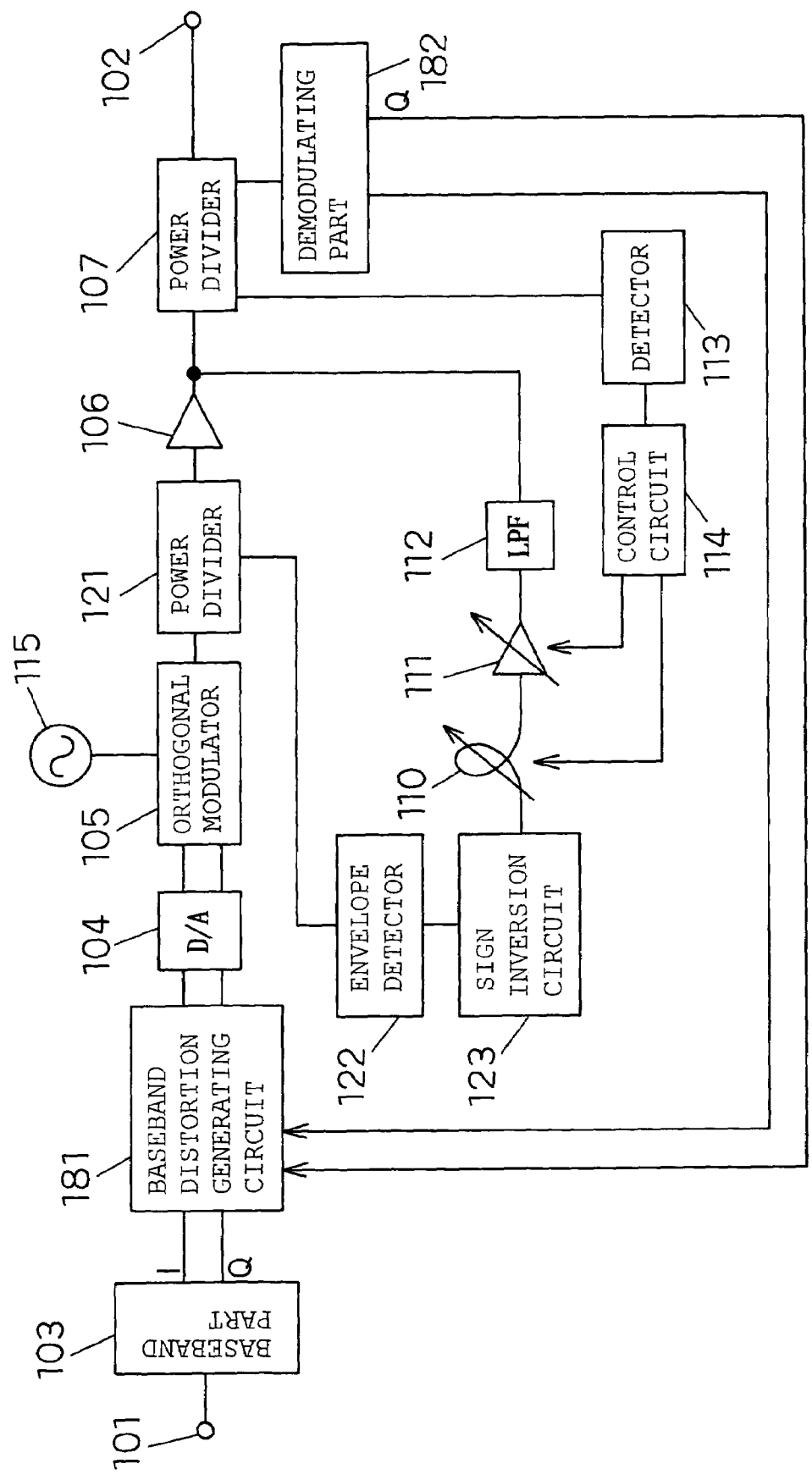
FIG. 25 is a block diagram showing another configuration of a power amplifier with predistortion compensation according to Embodiment 8 of the present invention.

The configuration of FIG. 14 is used as a basic configuration in the present embodiment. The configurations of FIGS. 24 and 25 are also applicable. These configurations are similar to those of FIGS. 18 and 19 in Embodiment 7, and the same effect can be obtained.

In the present embodiment, an inverted envelope component is injected into the output terminal of the amplifier 106. An inverted envelope component can be injected to the input terminal. This holds true for the configurations of FIGS. 24 and 25.

The present embodiment discussed a modulating signal of a single wave as an example. Even when a modulating signal has a plurality of waves, the same operation is performed and thus the same effect can be obtained.

As with the foregoing embodiments, a gain variable modulator 111 is used in the present embodiment. When an output level of an inverted envelope component from an inverted envelope generating circuit 108 satisfies a desired level of injection to the amplifier 106, a variable attenuator can be used instead of the gain variable modulator 111. Also in this case, the same effect can be obtained as the present embodiment.

As with the foregoing embodiments, variable delay circuits 110 and 134 are used in the present embodiment. A variable phase shifter can be used instead of one or both of the delay circuits. Also in this case, the same effect can be obtained as the present embodiment.

As with the foregoing embodiments, the variable delay circuit 110, the gain variable amplifier 111, and the low-pass filter 112 are arranged in this order in the present embodiment. These components can be arranged in any order. Further, although the variable delay circuit 110 is inserted into a path of transmitting an inverted envelope component, it is more desirable to insert the variable delay circuit 110 into a path between a power divider 121 and the amplifier 106. Also in this case, the same effect can be obtained.

The low-pass filter 112 is used in the present embodiment. The low-pass filter 112 can be omitted when a spurious band has a sufficiently low signal level.

Figure 26:
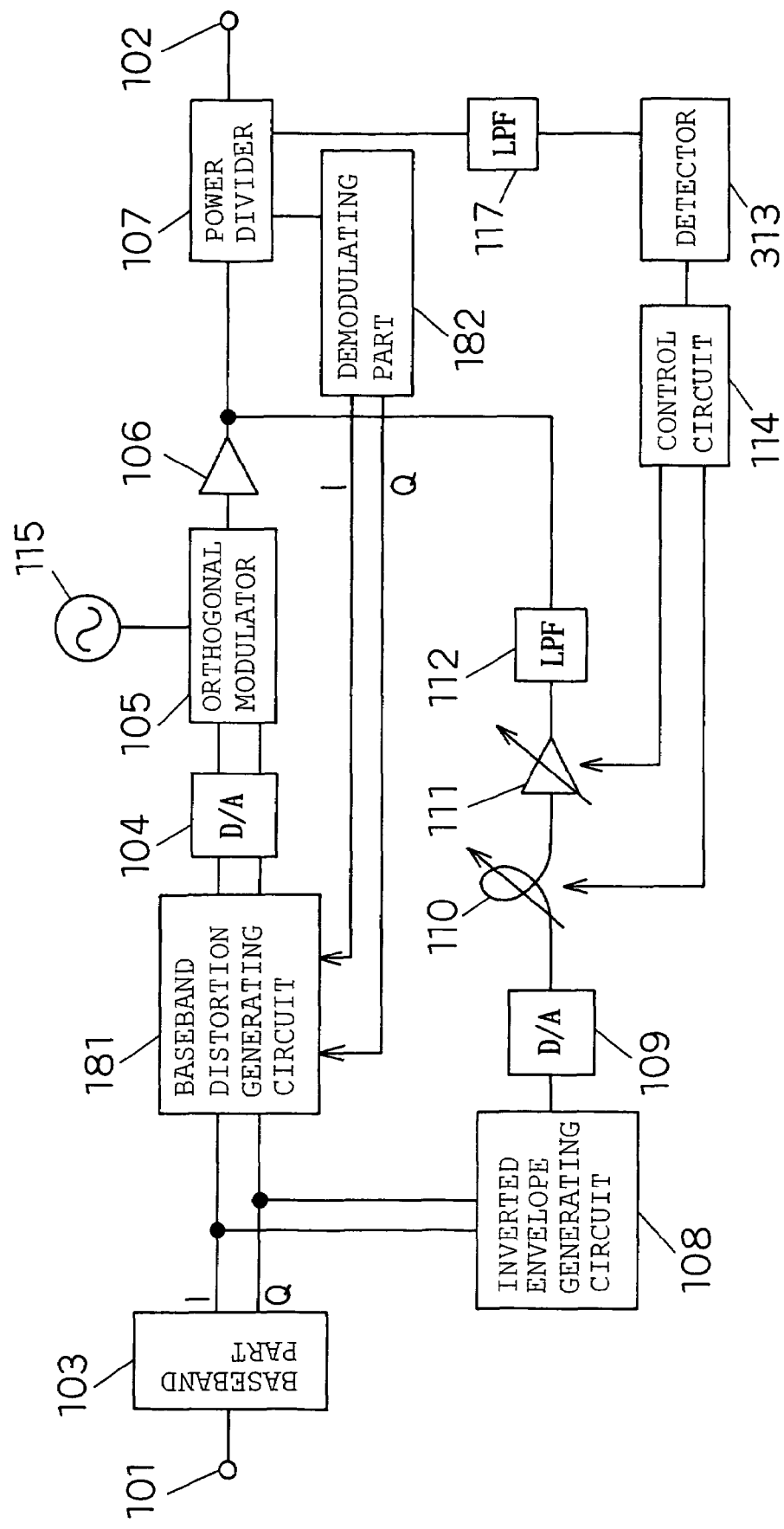
FIG. 26 is a block diagram showing another configuration of the power amplifier with predistortion compensation according to Embodiment 8 of the present invention.
Figure 27:
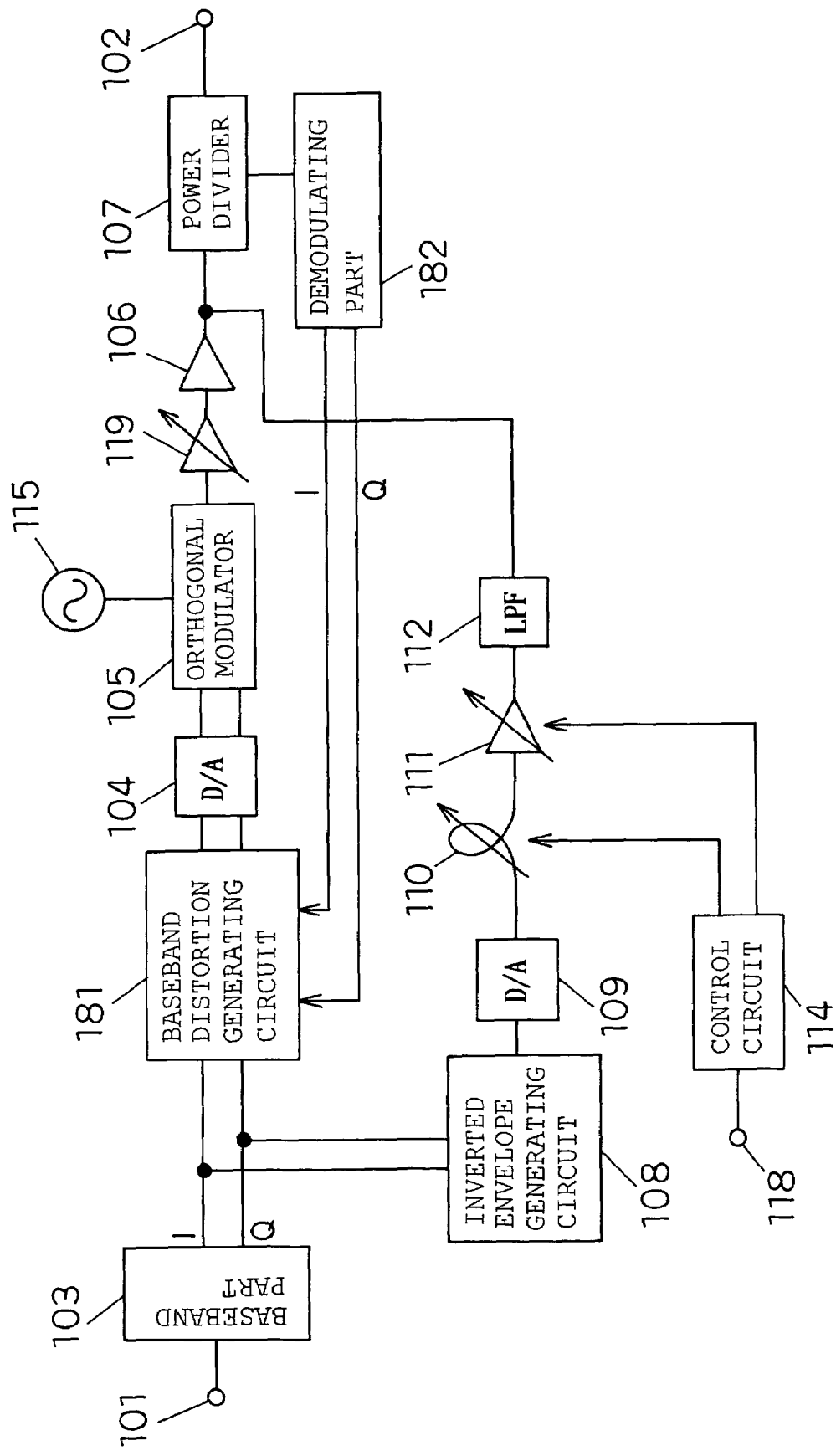
FIG. 27 is a block diagram showing another configuration of the power amplifier with predistortion compensation according to Embodiment 8 of the present invention.
Figure 28:
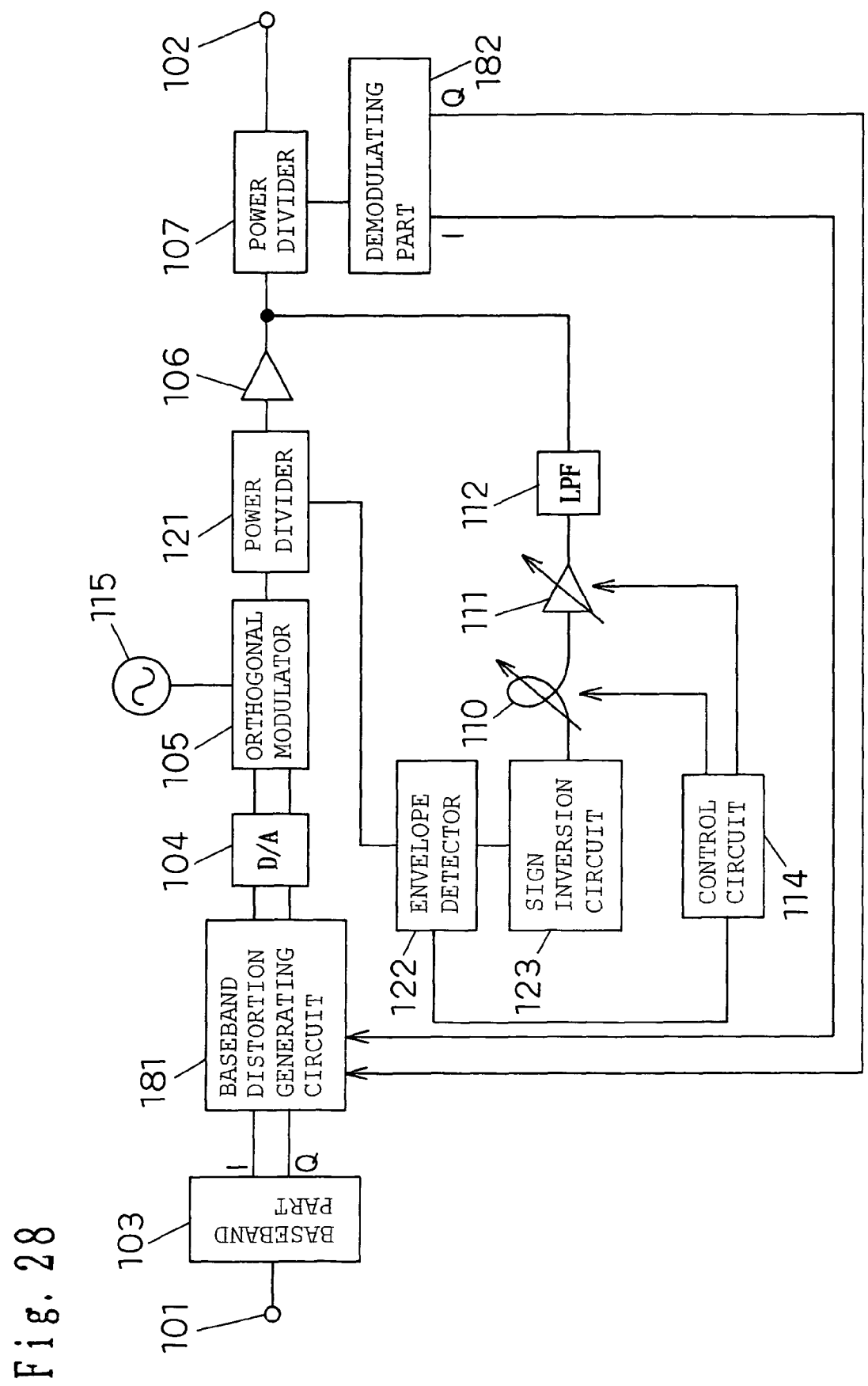
FIG. 28 is a block diagram showing another configuration of the power amplifier with predistortion compensation according to Embodiment 8 of the present invention.
Figure 29:
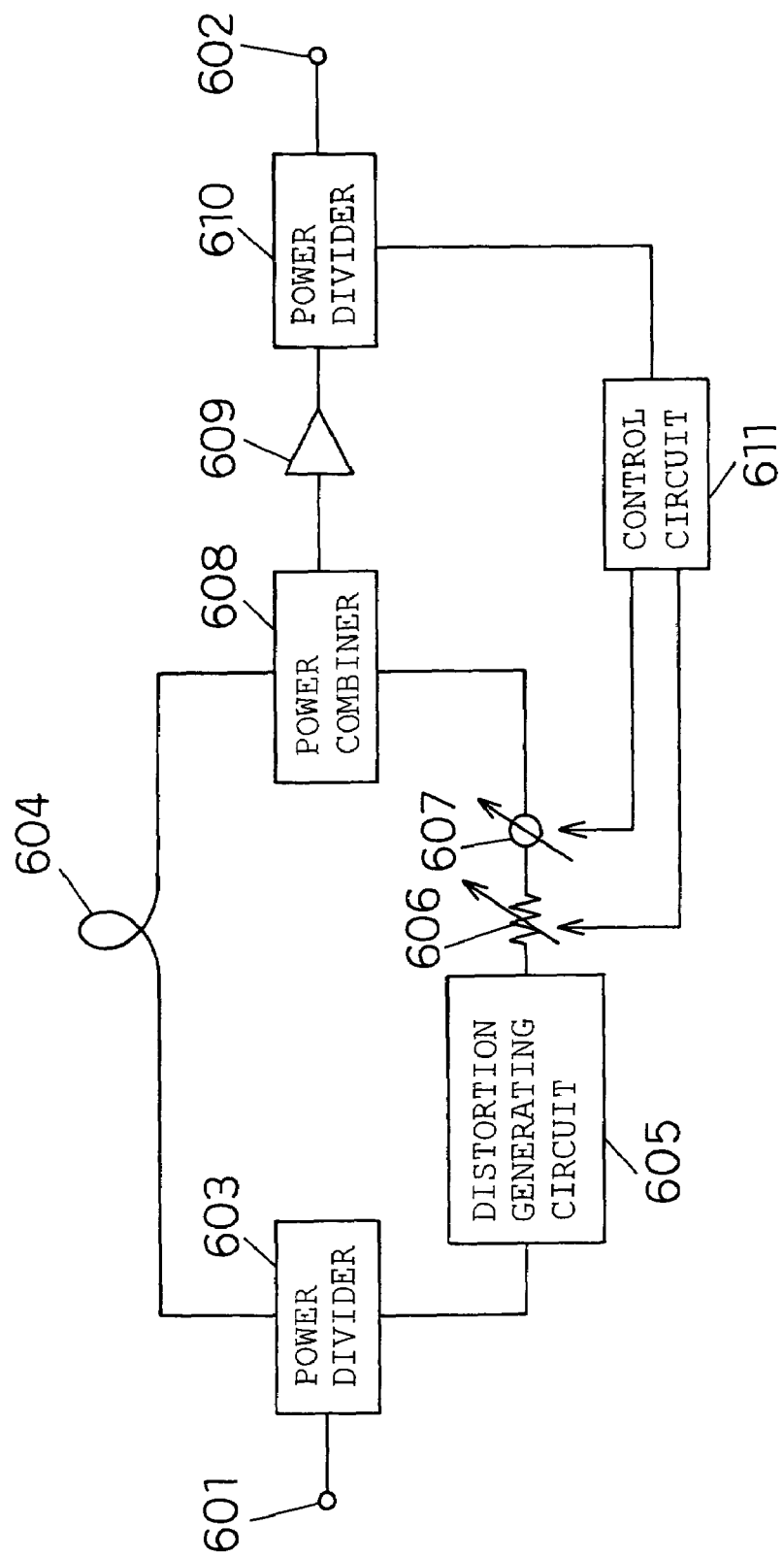
FIG. 29 is a block diagram showing a conventional power amplifier with predistortion compensation.

In the present embodiment, by detecting an output power level in a signal level detector 113, the variable delay circuit 110 and the gain variable amplifier 111 (or the variable attenuator) are controlled according to the level. As described in Embodiment 7, it is also possible to adopt the configuration in which a low-frequency component of an output signal shown in FIG. 26 is detected and the component is used to perform control, the configuration in which information about an output power level of FIG. 27 or a gain of the gain variable amplifier 119 is acquired in advance from a control signal terminal 118 and the information is used to perform control, or the configuration in which a part of the output of the envelope detector 122 shown in FIG. 28 is used to perform control. In this case, the operating principles of these circuits are the same as those of FIGS. 6, 7, and 10 that are described in Embodiments 1 and 3.

Further, the above explanation described that each detecting means is connected via the power divider connected to the output side of the amplifier 106. When each detecting means is connected to the output side of the amplifier 106, an output signal can be taken out. Thus, the configuration having no power divider is also applicable. The output side of the amplifier 106 indicates all the paths connected to the output of the amplifier 106.

Moreover, the above explanation described that each control circuit controls each amplitude adjusting means and each phase adjusting means so that a level of a distorted signal from the amplifier 106 or a predetermined signal level is minimum. The same effect can be obtained in the case where control is performed as if a level of a distorted signal or a predetermined signal level was substantially minimum while the level is not minimum.

Additionally, in the above explanation, based on information about a signal level of an amplified high-frequency signal or a signal level of a modulation frequency band included in the high-frequency signal, adjustment is performed on (a) amplitude of an inverted envelope signal and/or (b) a phase of the inverted envelope signal or a phase of the amplified high-frequency signal so that a signal level of a modulation frequency band is substantially minimum, and then, the inverted envelope is injected. In the present invention, the above objective may also be attained only with the configuration in which a high-frequency signal modulated by an input signal is amplified and the inverted envelope signal is only injected into a high-frequency signal modulated by an input signal or into the amplified high-frequency signal.

Figure 30:
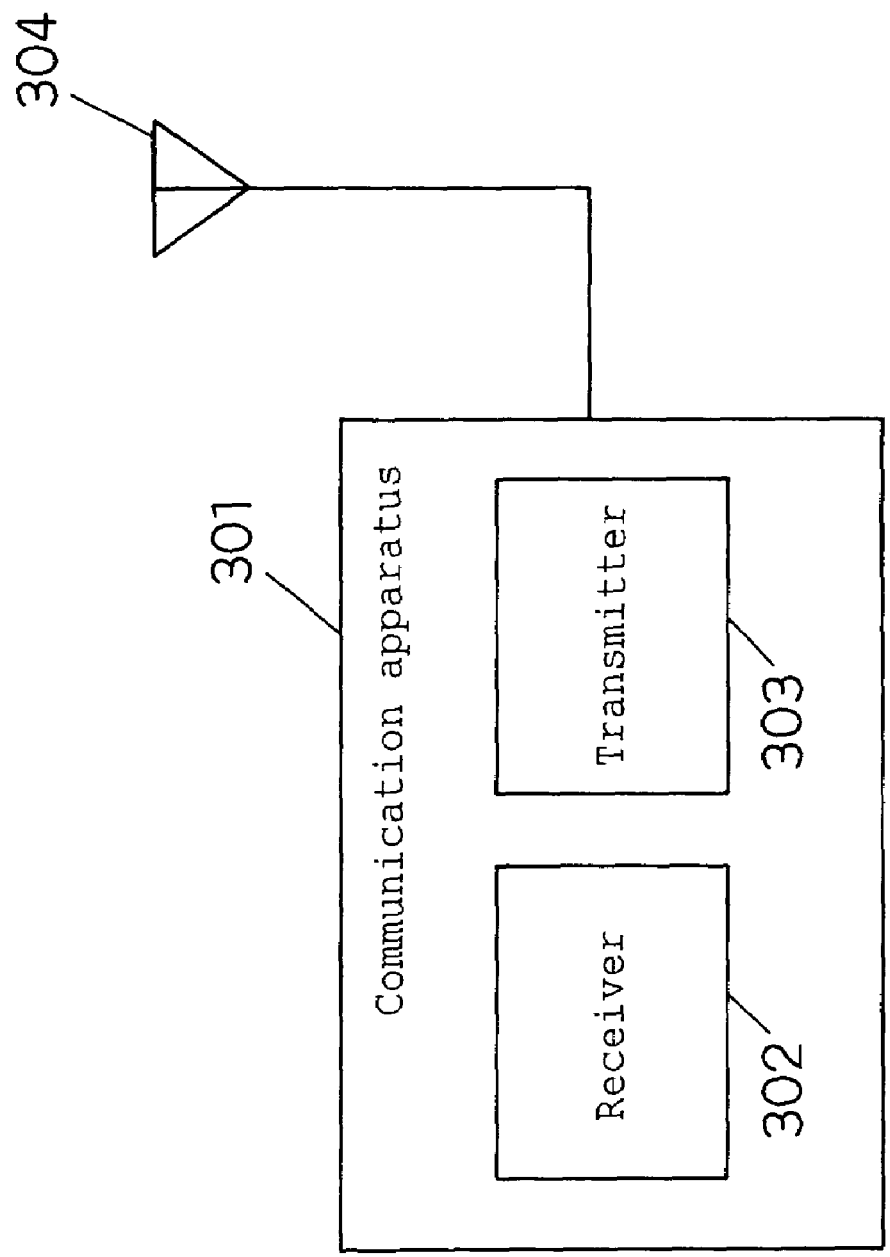
FIG. 30 is a block diagram showing the configuration of a communication apparatus using the power amplifier of the present invention.

Additionally, the scope of the present invention also includes a transmitter 303 which transmits a transmission signal and has the power amplifier described above, and a communication apparatus 301 which comprises the transmitter 303 and a receiver 302 for receiving a signal to be received. FIG. 30 shows an example of the communication apparatus 301 configured thus.

As described above, the present invention makes it possible to provide a power amplifying method or a power amplifier whereby a level difference can be reduced between ACPL and ACPU generated in the power amplifier.

Further, when the distortion generating circuit is provided, even when ACPL and ACPU generated in the power amplifier have a large level difference, it is possible to obtain a great effect of suppressing distortion.

What is claimed is:

1. A power amplifying method, comprising the steps of:
   amplifying a high-frequency signal modulated by an input signal;
   generating an inverted envelope signal by using the input signal or the high-frequency signal, the inverted envelope signal having an inverted envelope which is an inverted one of both envelopes of the high-frequency signal, and injecting the inverted envelope signal into the high-frequency signal or the amplified high-frequency signal, wherein based on information about a signal level of the amplified high-frequency signal or a signal level of a modulation frequency band included in the high-frequency signal, adjustment is performed on (a) amplitude of the inverted envelope signal and/or (b) a phase of the inverted envelope signal or a phase of the high-frequency signal before the injecting step so that a signal level of the modulation frequency band is substantially minimum.

2. A power amplifier, comprising:

amplifying means of amplifying a high-frequency signal modulated by an input signal, inverted envelope generating means of generating an inverted envelope signal by using the input signal or the high-frequency signal, the inverted envelope signal having an inverted envelope which is an inverted one of both envelopes of the high-frequency signal, wherein the inverted envelope signal is injected into the high-frequency signal or the amplified high-frequency signal, first amplitude adjusting means of adjusting amplitude of the inverted envelope signal, first phase adjusting means of adjusting a phase of the high-frequency signal or the inverted envelope signal, and a control circuit of outputting a control signal to the first amplitude adjusting means and the first chase adjusting means based on information about a signal level of the amplified high-frequency signal or a signal level of a modulation frequency band included in the high-frequency signal, wherein the inverted envelope signal having been adjusted in amplitude or phase is injected into the high-frequency signal or the amplified high-frequency signal, and the control circuit controls the first amplitude adjusting means and/or the first phase adjusting means so that the modulation frequency band has a substantially minimum signal level.

3. The power amplifier according to claim 2, further comprising a distortion generating circuit generating a distorted signal for canceling distortion generated from the amplifying means and injecting the distorted signal into an input side of the amplifying means.

4. The power amplifier according to claim 3, wherein the inverted envelope signal is injected into the amplified high-frequency signal.

5. The power amplifier according to claim 3, wherein the inverted envelope signal is injected via the distortion generating circuit to the high-frequency signal inputted to the amplifying means.

6. The power amplifier according to claim 3, further comprising a baseband part of generating an I signal and a Q signal orthogonal to the I signal from the input signal, and a demodulating part demodulating the modulated high-frequency signal into the I signal and the Q signal, wherein the distortion generating circuit generates a distorted signal for canceling distortion in the amplified high-frequency signal, based on the I signal and Q signal generated in the baseband part and the I signal and Q signal outputted from the demodulating part.

7. The power amplifier according to claim 6, wherein the distortion generating circuit is provided in the baseband part.

8. The power amplifier according to claim 3, wherein the distortion generating circuit generates the distorted signal when the inverted envelope signal adjusted in amplitude or phase is inputted.

9. The power amplifier according to claim 8, further comprising:

second amplitude adjusting means of further adjusting amplitude of the inverted envelope signal inputted to the distortion generating circuit, the inverted envelope signal having been adjusted in amplitude or phase, and second phase adjusting means of further adjusting a phase of the inverted envelope signal inputted to the distortion generating circuit, the inverted envelope signal having been adjusted in amplitude or phase, wherein amplitude and/or a phase of a signal inputted to the distortion generating circuit is further adjusted by the second amplitude adjusting means and the second phase adjusting means so that the modulation frequency band has a substantially minimum signal level.

10. The power amplifier according to claim 9, further comprising first level detecting means of detecting a signal level of the amplified high-frequency signal, wherein at least one of the first amplitude adjusting means, the first phase adjusting means, the second amplitude control means, and the second phase control means is controlled by the control circuit based on information acquired by the first level detecting means about a signal level of the amplified signal.

11. The power amplifier according to claim 9, further comprising:

a low-pass filter connected to an output side of the amplifying means, and second level detecting means connected to an output side of the low-pass filter, wherein a signal of the modulation frequency band is taken out from the amplified high-frequency signal by the low-pass filter, a signal level of the modulation frequency band is detected by the second level detecting means, and the first amplitude control means, the first phase control means, the second amplitude control means, and the second phase control means are controlled by the control circuit so that the modulation frequency band has a substantially minimum signal level.

12. The power amplifier according to claim 9, further comprising third level detecting means of detecting a signal level of a high-frequency signal before the signal is inputted to the amplifying means, wherein at least one of the first amplitude control means, the first phase control means, the second amplitude control means, and the second phase control means is controlled based on the signal having been subjected to level detection.

13. The power amplifier according to claim 9, wherein the second amplitude adjusting means and/or the second phase adjusting means is controlled based on information about a signal level of the input signal or a signal level of the signal outputted from the power amplifier.

14. The power amplifier according to claim 8, wherein the inverted envelope signal generated from the inverted envelope circuit or the inverted envelope signal having been adjusted in amplitude or phase is inputted to an input side of the distortion generating circuit or the distortion generating circuit via a series circuit constituted of a coil and a capacitor.

15. The power amplifier according to claim 2, wherein the inverted envelope generating means comprises an envelope detector of detecting an envelope of the high-frequency signal and a sign inversion circuit of inverting a sign of the envelope-detected signal, and the envelope-detected signal having the inverted sign is outputted as an inverted envelope signal.

16. The power amplifier according to claim 15, wherein the inverted envelope signal outputted from the inverted envelope generating means is injected into an input side of the amplifying means.

17. The power amplifier according to claim 2, further comprising a baseband part generating an I signal and a Q signal orthogonal to the I signal, wherein the inverted envelope generating means calculates $-(I^2+Q^2)^{1/2}$ based on the I signal and the Q signal and outputs a result as the inverted envelope signal.

18. The power amplifier according to claim 17, wherein the inverted envelope generating means is provided in the baseband part.

19. The power amplifier according to claim 2, further comprising first level detecting means of detecting a signal level of the amplified high-frequency signal, wherein the first amplitude adjusting means and/or the first phase adjusting means is controlled by the control circuit based on information acquired by the first level detecting means about the signal level of the amplified signal.

20. The power amplifier according to claim 2, further comprising:

a low-pass filter connected to an output side of the amplifying means, and second level detecting means connected to an output side of the low-pass filter, wherein a signal of the modulation frequency band is taken out from the amplified high-frequency signal by the low-pass filter, a signal level of the modulation frequency band is detected by the second level detecting means, and the first amplitude adjusting means and/or the first phase adjusting means is controlled by the control circuit so that the modulation frequency band has a substantially minimum signal level.

21. The power amplifier according to claim 2, further comprising third level detecting means of detecting a signal level of a high-frequency signal before the signal is inputted to the amplifying means, wherein the first amplitude control means and/or the first phase control means is controlled based on the signal having been subjected to level detection.

22. The power amplifier according to claim 2, wherein the inverted envelope signal generated from the inverted envelope circuit or the inverted envelope signal having been adjusted in amplitude or phase is injected to the high-frequency signal or the amplified high-frequency signal via a series circuit constituted of a coil and a capacitor.

23. The power amplifier according to claims 14 or 22, wherein a resistor is used instead of the coil.

24. A communication apparatus, comprising:

a transmitter which transmits a transmission signal and has a power amplifier described in claim 2, and a receiver of receiving a signal to be received.

* * * * *

UNITED STATES PATENT AND TRADEMARK OFFICE
CERTIFICATE OF CORRECTION

| | |
|---|---|
| PATENT NO. | : 7,209,715 B2 |
| APPLICATION NO. | : 10/629267 |
| DATED | : April 24, 2007 |
| INVENTOR(S) | : Toshimitsu Matsuyoshi |

Page 1 of 1

It is certified that error appears in the above-identified patent and that said Letters Patent is hereby corrected as shown below:

In column 23, line 33 of the Letters Patent, in claim 2 (Amendment claim 3), "the first chase" should read --the first phase--.

Signed and Sealed this

Twenty-sixth Day of February, 2008

JON W. DUDAS
*Director of the United States Patent and Trademark Office*